US008324032B2

(12) United States Patent
Ohnuma et al.

(10) Patent No.: US 8,324,032 B2
(45) Date of Patent: Dec. 4, 2012

(54) METHOD OF MANUFACTURING A SEMICONDUCTOR DEVICE

(75) Inventors: Hideto Ohnuma, Kanagawa (JP); Ichiro Uehara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/152,492

(22) Filed: Jun. 3, 2011

(65) Prior Publication Data
US 2011/0294266 A1 Dec. 1, 2011

Related U.S. Application Data

(60) Continuation of application No. 12/823,175, filed on Jun. 25, 2010, now Pat. No. 7,955,912, which is a continuation of application No. 11/969,247, filed on Jan. 4, 2008, now Pat. No. 7,745,271, which is a continuation of application No. 11/754,484, filed on May 29, 2007, now Pat. No. 7,316,946, which is a division of application No. 09/925,512, filed on Aug. 10, 2001, now Pat. No. 7,223,643.

(30) Foreign Application Priority Data

Aug. 11, 2000 (JP) .................................. 2000-244860
Sep. 4, 2000 (JP) .................................. 2000-267851

(51) Int. Cl.
*H01L 21/84* (2006.01)
(52) U.S. Cl. ................ 438/154; 257/E21.561; 438/155; 438/164
(58) Field of Classification Search .......... 438/151–166; 257/E21.561
See application file for complete search history.

(56) References Cited

U.S. PATENT DOCUMENTS

| 4,818,715 A | 4/1989 | Chao |
| 5,371,025 A | 12/1994 | Sung |
| 5,744,381 A | 4/1998 | Tabata et al. |

(Continued)

FOREIGN PATENT DOCUMENTS

EP 1003223 A2 5/2000
(Continued)

OTHER PUBLICATIONS

C.W. Kim et al.; "42.1: A Novel Four-Mask-Count Process Architecture for TFT-LCDs"; SID 00 Digest; pp. 1006-1009; 2000.

*Primary Examiner* — Richard A. Booth
(74) *Attorney, Agent, or Firm* — Fish & Richardson P.C.

(57) ABSTRACT

Formation of LDD structures and GOLD structures in a semiconductor device is conventionally performed in a self aligning manner with gate electrodes as masks, but there are many cases in which the gate electrodes have two layer structures, and film formation processes and etching processes become complex. Further, in order to perform formation of LDD structures and GOLD structures only by processes such as dry etching, the transistor structures all have the same structure, and it is difficult to form LDD structures, GOLD structures, and single drain structures separately for different circuits. By applying a photolithography process for forming gate electrodes to photomasks or reticles, in which supplemental patterns having a function of reducing, the intensity of light and composed of diffraction grating patterns or translucent films, are established, GOLD structure, LDD structure, and single drain structure transistors can be easily manufactured for different circuits through dry etching and ion injection process steps.

19 Claims, 21 Drawing Sheets

U.S. PATENT DOCUMENTS

| | | | |
|---|---|---|---|
| 6,071,652 | A | 6/2000 | Feldman et al. |
| 6,255,130 | B1 | 7/2001 | Kim |
| 6,335,290 | B1 | 1/2002 | Ishida |
| 6,365,917 | B1 | 4/2002 | Yamazaki |
| 6,420,073 | B1 | 7/2002 | Suleski et al. |
| 6,420,758 | B1 | 7/2002 | Nakajima |
| 6,515,336 | B1 | 2/2003 | Suzawa et al. |
| 6,534,425 | B1 | 3/2003 | Karr et al. |
| 6,534,826 | B2 | 3/2003 | Yamazaki |
| 6,541,294 | B1 | 4/2003 | Yamazaki et al. |
| 6,613,620 | B2 | 9/2003 | Fujimoto et al. |
| 6,638,667 | B2 | 10/2003 | Suleski et al. |
| 6,646,287 | B1 | 11/2003 | Ono et al. |
| 6,660,462 | B1 | 12/2003 | Fukuda |
| 6,664,145 | B1 | 12/2003 | Yamazaki et al. |
| 6,670,284 | B2 | 12/2003 | Yin |
| 6,707,068 | B2 | 3/2004 | Fujimoto et al. |
| 6,773,996 | B2 | 8/2004 | Suzawa et al. |
| 6,803,601 | B2 | 10/2004 | Nakajima |
| 6,828,586 | B2 | 12/2004 | Fujimoto et al. |
| 6,872,604 | B2 | 3/2005 | Yamazaki et al. |
| 6,909,114 | B1 | 6/2005 | Yamazaki |
| 7,169,656 | B2 | 1/2007 | Ohnuma et al. |
| 7,202,499 | B2 | 4/2007 | Nakajima |
| 7,223,643 | B2 * | 5/2007 | Ohnuma et al. ............. 438/163 |
| 7,316,946 | B2 * | 1/2008 | Ohnuma et al. ............. 438/163 |
| 7,745,271 | B2 * | 6/2010 | Ohnuma et al. ............. 438/166 |
| 7,955,912 | B2 * | 6/2011 | Ohnuma et al. ............. 438/155 |
| 2001/0019127 | A1 | 9/2001 | Ishida |
| 2002/0146627 | A1 | 10/2002 | Suleski et al. |
| 2002/0160547 | A1 | 10/2002 | Shih |

FOREIGN PATENT DOCUMENTS

| | | |
|---|---|---|
| JP | 02-156624 A | 6/1990 |
| JP | 10032327 A | 2/1998 |
| JP | 2000-164886 A | 6/2000 |
| JP | 2000-216399 A | 8/2000 |
| JP | 2001-94113 A | 4/2001 |

* cited by examiner

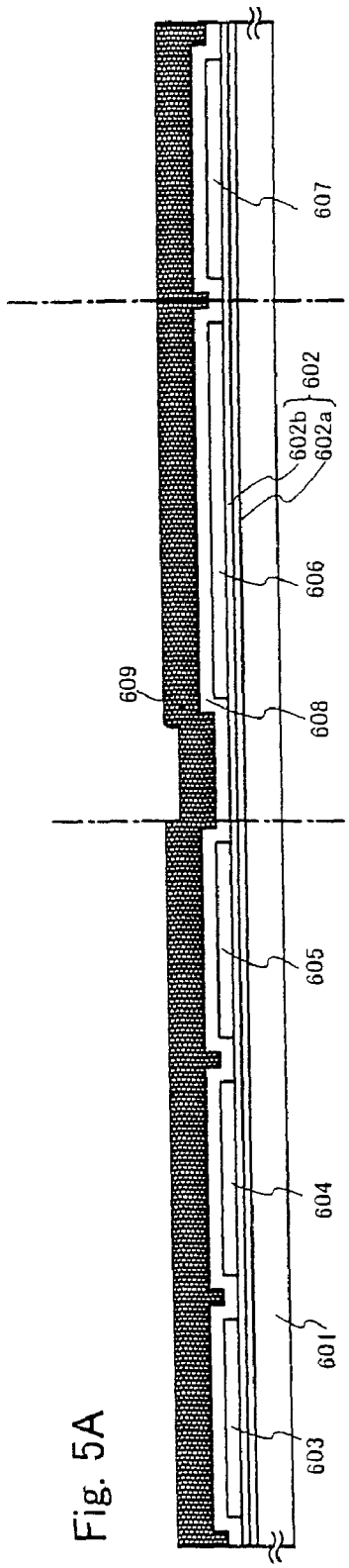
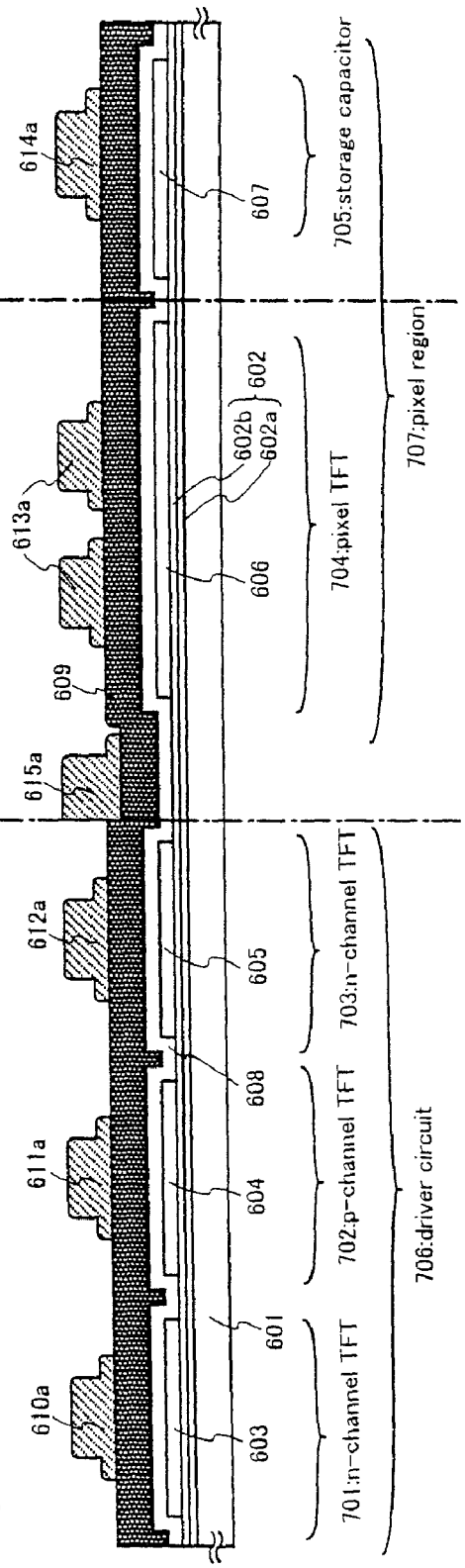
Fig. 5A
Fig. 5B

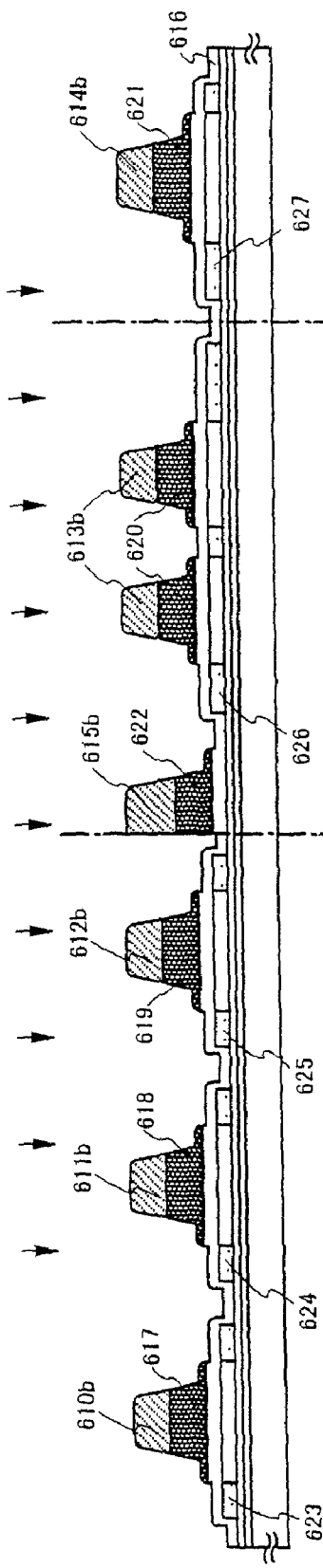
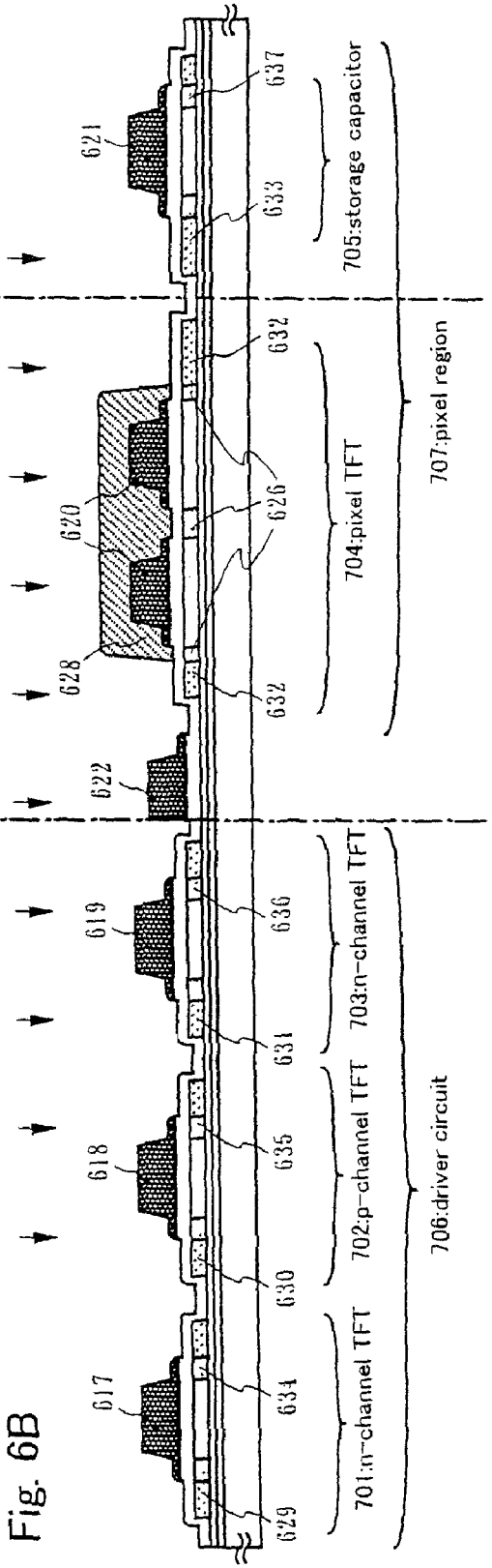
Fig. 6A
Fig. 6B

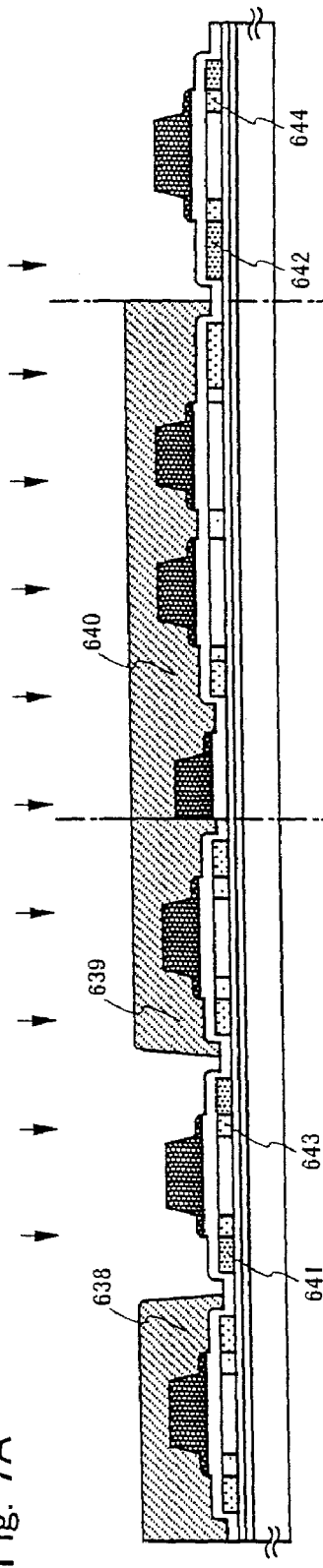
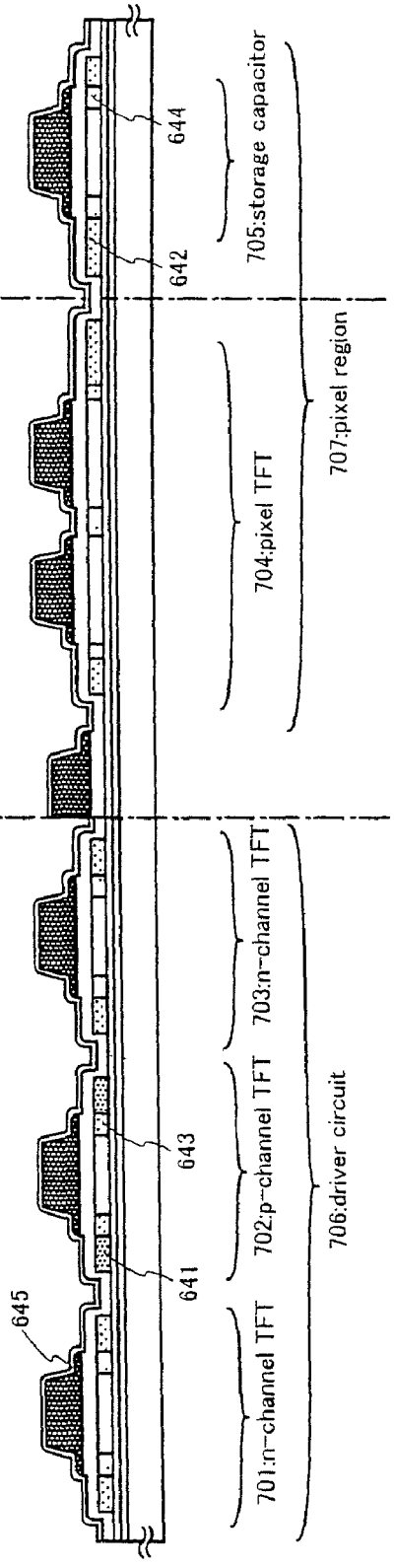
Fig. 7A
Fig. 7B

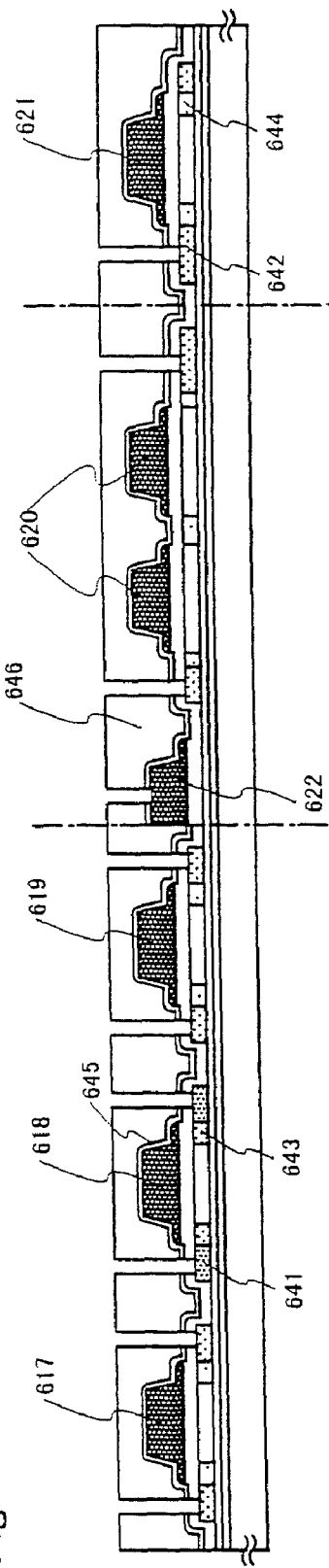
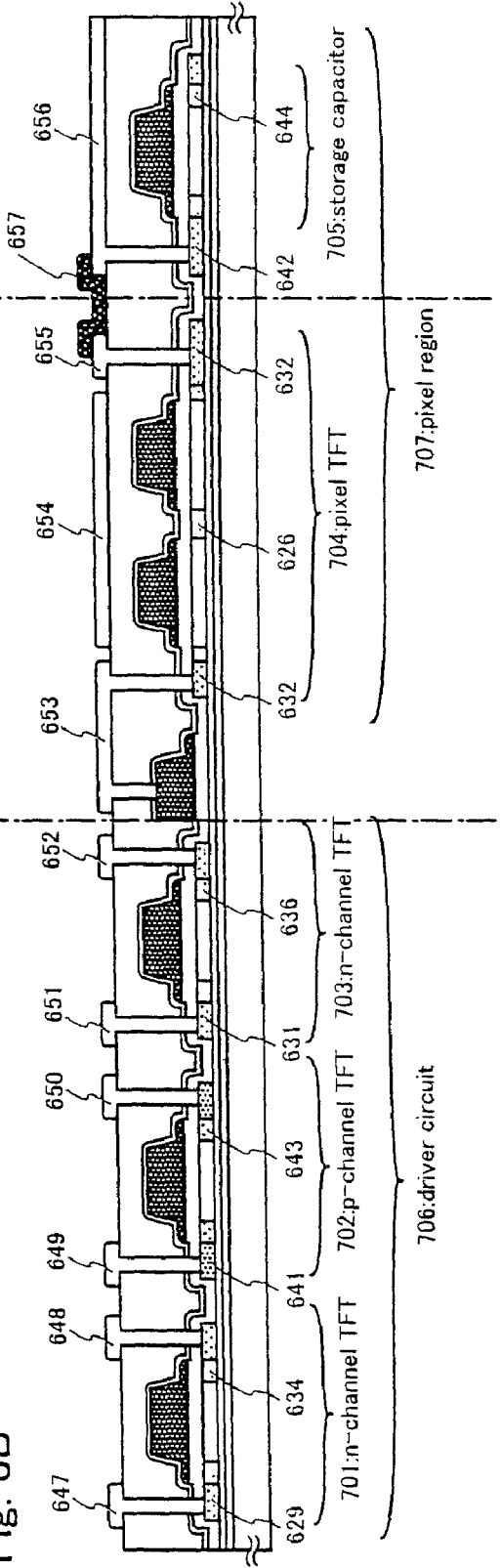

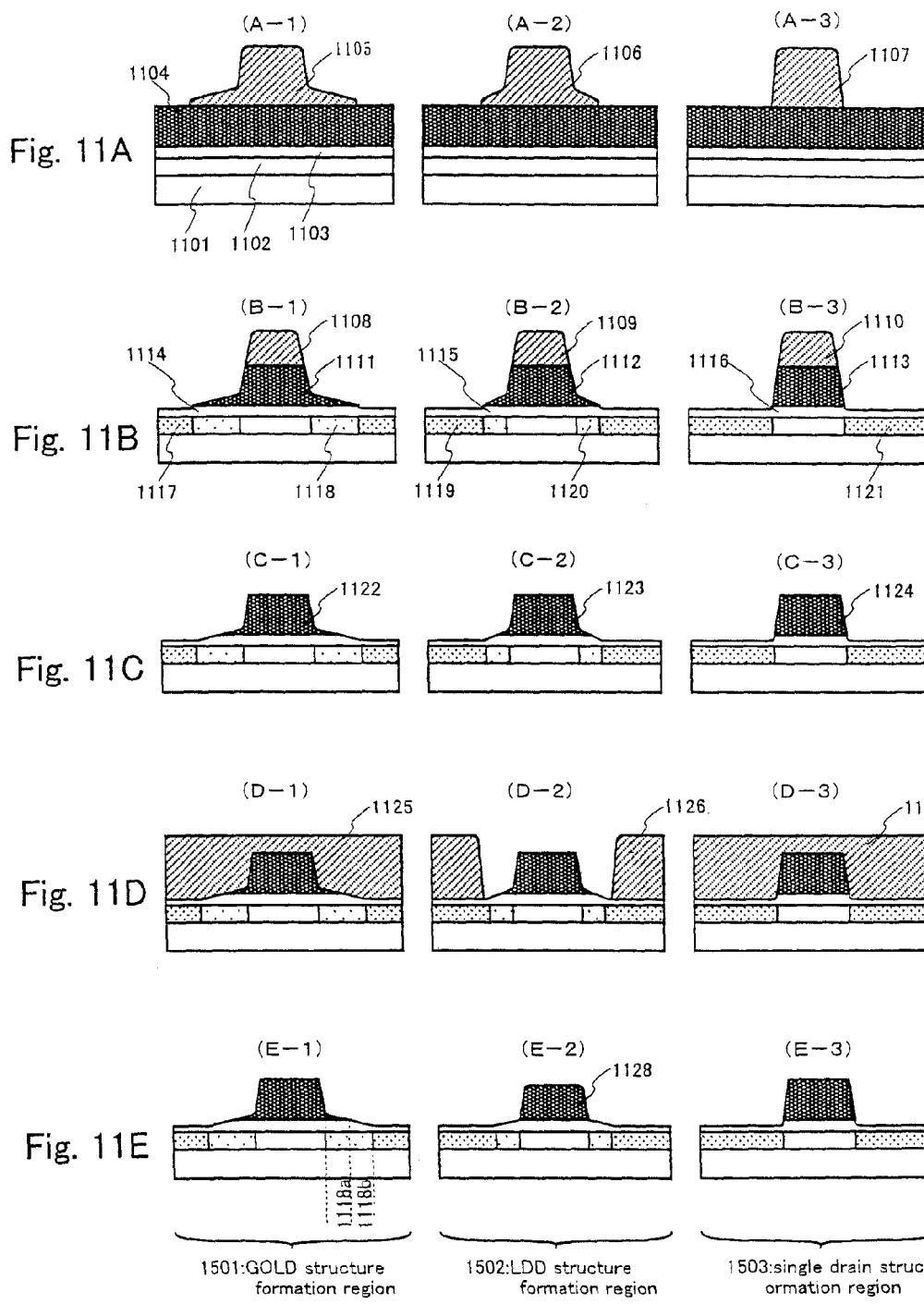

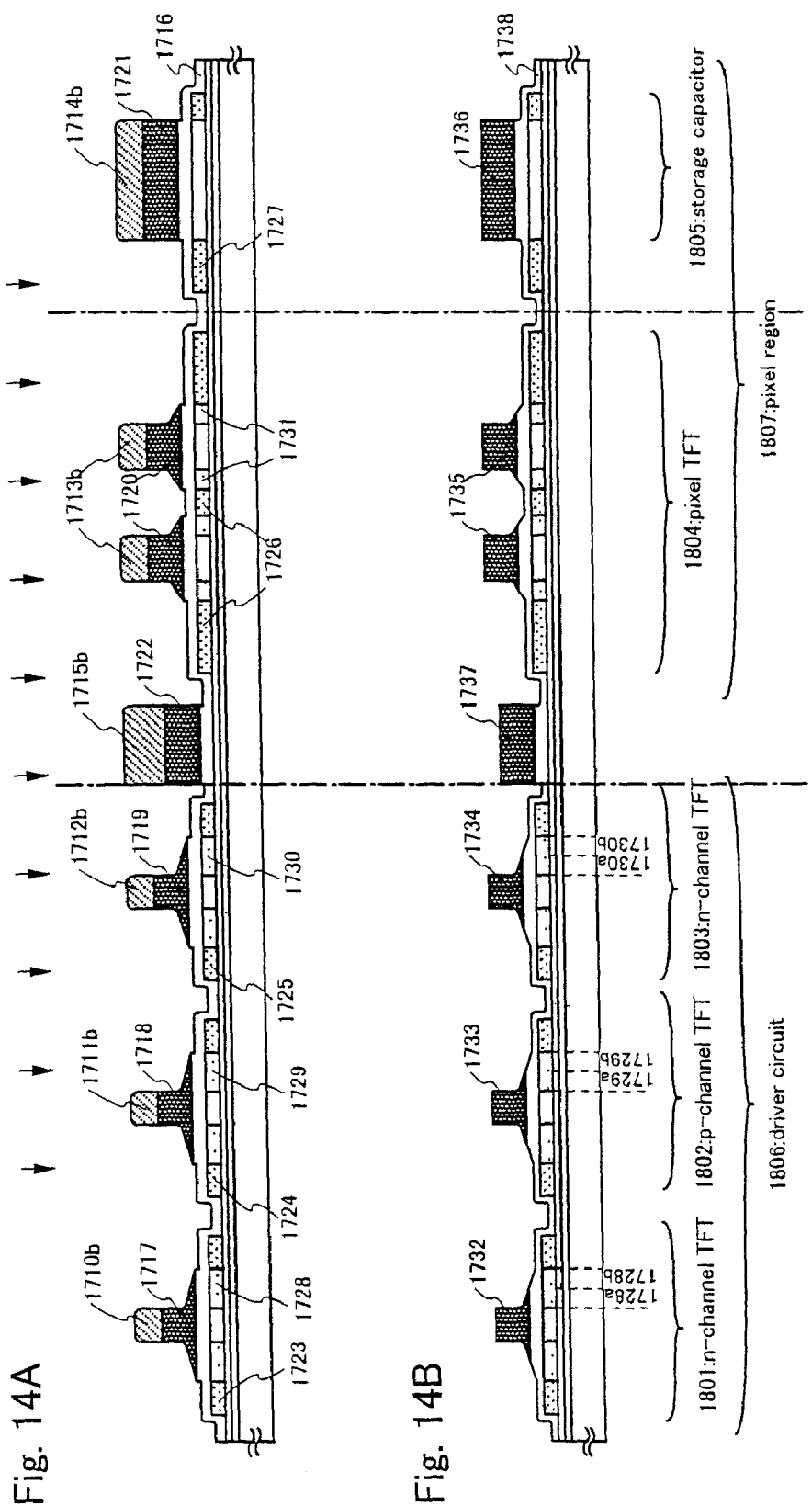

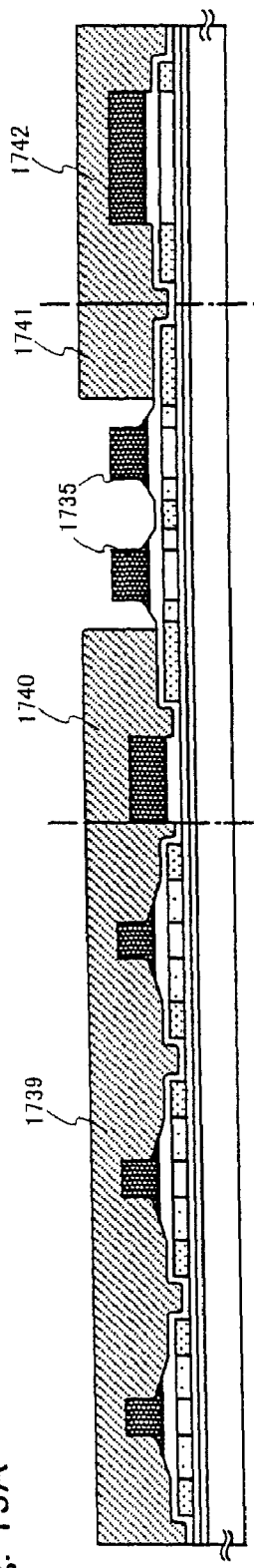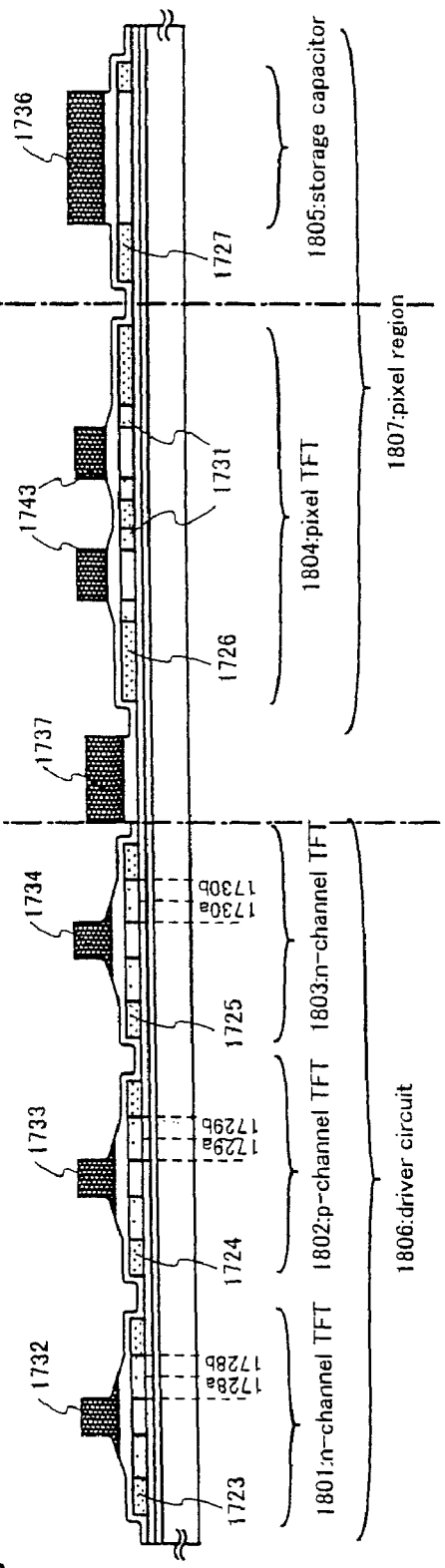
Fig. 15A
Fig. 15B

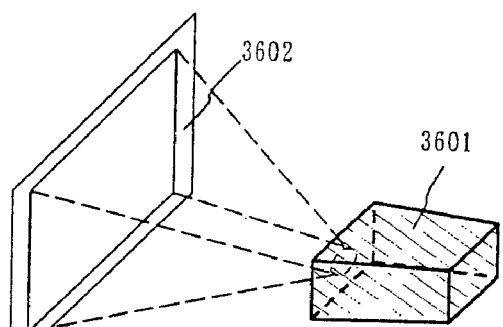
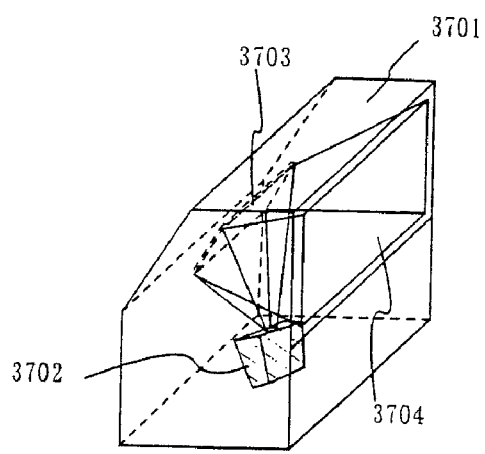
Fig. 19A          Fig. 19B
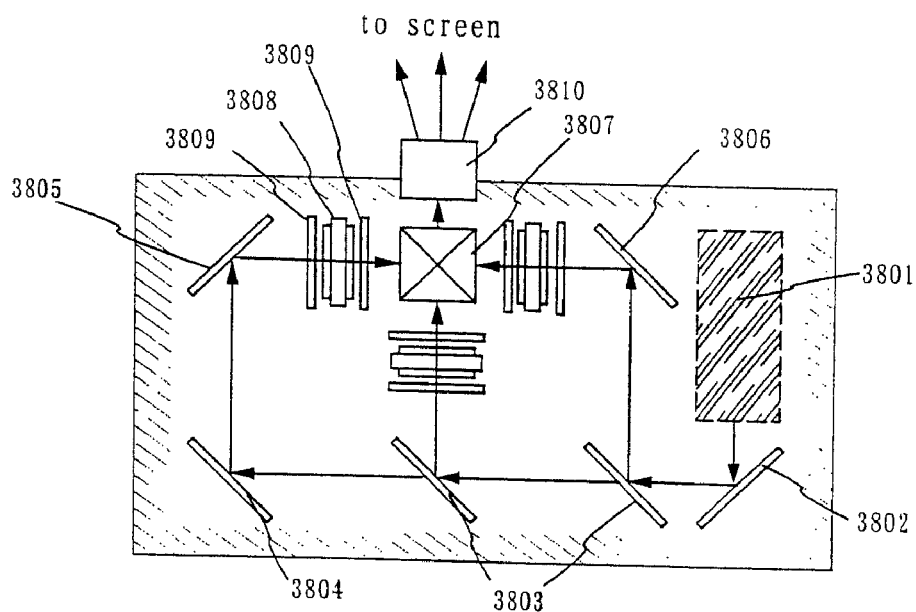
Fig. 19C
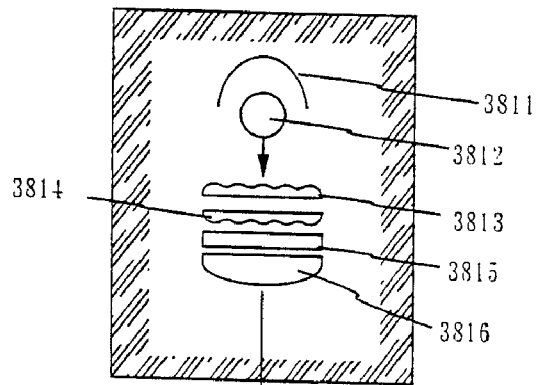
Fig. 19D 1401: GOLD structure formation region
1402: LDD structure formation region
1403: single drain formation region

METHOD OF MANUFACTURING A SEMICONDUCTOR DEVICE

CROSS-REFERENCE TO RELATED APPLICATIONS

This application is a continuation of U.S. application Ser. No. 12/823,175, filed Jun. 25, 2010, now allowed, which is a continuation of U.S. application Ser. No. 11/969,247, filed Jan. 4, 2008, now U.S. Pat. No. 7,745,271, which is a continuation of U.S. application Ser. No. 11/754,484, filed May 29, 2007, now U.S. Pat. No. 7,316,946, which is a divisional of U.S. application Ser. No. 09/925,512, filed Aug. 10, 2001, now U.S. Pat. No. 7,223,643, which claims the benefit of foreign priority applications filed in Japan as Serial No. 2000-244860 on Aug. 11, 2000, and Serial No. 2000-267851 on Sep. 4, 2000, all of which are incorporated by reference.

BACKGROUND OF THE INVENTION

1. Field of the Invention

The present invention relates to a method of manufacturing a semiconductor device having circuits formed by thin film transistors (hereafter abbreviated as TFTs) and by MOS transistors. As examples of semiconductor devices, there are electro-optical devices structured by TFTs, such as liquid crystal displays and EL (electroluminescence) displays, and LSIs structured by MOS transistors.

2. Description of the Related Art

Techniques of utilizing TFTs for active matrix liquid crystal displays have been in the spotlight in recent years. Active matrix displays are advantageous compared to passive matrix displays in response time, in angle of view, and in contrast, and therefore active matrix displays are in the mainstream at present in devices such as notebook computers and liquid crystal televisions.

In general, amorphous silicon or polycrystalline silicon is made into a channel layer (channel forming region) in a TFT. In particular, a polysilicon TFT manufactured by using only low temperature processes (generally equal to or less than 60° C.) can be made low cost, can have a large surface area, and at the same time can have electric field mobility with a large electron or hole. Consequently, not only pixel transistors, but also integration of driver circuits in the periphery of the pixel transistors can be achieved when polysilicon TFTs are used in liquid crystal displays. Manufacturers of liquid crystal displays have been making advances in the development of such uses.

However, when polycrystalline silicon TFTs are used, phenomena such as a reduction in the mobility and on current (the electric current flowing when a TFT is in an on state), and an increase in the off current (the electric current flowing when the TFT is in an off state) are observed as deterioration of reliability, and there are times when these phenomena become large problems with respect to reliability. These phenomena are referred to as hot carrier phenomena, and are known to be the work of hot carriers generated by a high electric field in the vicinity of a drain.

The hot carrier phenomena are phenomena which were first discovered in MOS transistors. Various types of basic examinations have been performed as ways of overcoming hot carriers, and with MOS transistors having a design rule equal to or less than 1.5 µm, an LDD (lightly doped drain) structure is employed as a measure against the hot carrier phenomena due to a high electric field in the vicinity of the drain. With an LDD structure, low concentration impurity regions (n−regions or p−regions) are formed in edge portions of a drain region by utilizing the sidewalls of gate sidewalls, and the electric field concentration in the vicinity of the drain is relaxed in a contact portion between the channel forming region and the drain region by making the contact portion possess a is sloped impurity concentration.

However, the voltage resistance of the drain increases greatly for the LDD structure case compared with a single drain structure, and the resistance of the low concentration impurity regions (n−regions or p−regions) large, and thus a disadvantage of a reduction in the drain current exists. Further, a high electric field region exists directly beneath the sidewalls, the impact ionization becomes large there, and hot electrons are injected into the sidewalls. The low concentration impurity regions (n−regions or p−regions) are depleted, and a degradation mode in which there is an additional increase in resistance, peculiar to the LDD, becomes a problem. The above problem becomes more tangible as the channel length decreases, and GOLD (gate-drain overlapped LDD) structure in which a low concentration impurity region (n−region) is formed overlapping with edge portions of the gate electrode has been proposed to be employed with MOS transistors having a channel length equal to or less than 0.5 µm in order to overcome this problem.

The employment of LDD structures and GOLD structures have also been considered in polycrystalline silicon TFTs as well, with an aim similar to that in MOS transistors, relieving the high electric field in the vicinity of the drain. With the LDD structure, a low concentration impurity region (n−region or p−region) is formed in a polycrystalline silicon layer corresponding to a region on the outside of a gate electrode, and a high concentration impurity regions (n+region or p+region) which becomes a source region and a drain region are formed on the outside of the low concentration impurity region. This is highly effective in suppressing the value of the off current, but there is only a small effect against hot carriers due to the reduction in the electric field near the drain. On the other hand, a low concentration impurity region (n−region or p−region) of the LDD structure is formed overlapping with edge portions of the gate electrode with the GOLD structure, and although it is a larger effect against hot carriers compared to the LDD structure, it also has a disadvantage in that the value of the off current becomes large.

The formation of high concentration impurity regions (n+region or p+region) which become source regions and drain regions of LDD structures and GOLD structures in a polycrystalline silicon TFT and in a MOS transistor, and the formation of low concentration impurity regions (n−region or p−region) on the inside of the high impurity concentration regions, have conventionally been performed in a self aligning manner with the gate electrode as a mask, and these have the advantage of being able to prevent an increase in the number of photolithography process steps. If the gate electrode is formed as a two layer structure, then it can be manufactured more easily than with a single layer structure, and the two layer structure is often used. However, there is a problem in that the film formation processes and the etching processes become complex if a two layer gate electrode structure is used.

Further, there are various circuits inside semiconductor devices, and there are times when a GOLD structure, superior for its hot carrier handling effect, is appropriate, while there are times when a low off current value LDD structure is suitable. There are also cases in which a single drain structure is appropriate. The formation of LDD structures and GOLD structures is performed by using processes such as dry etching only, and all of the transistors in the semiconductor device have the same structure; therefore there is a problem in that single drain structures, LDD structures and GOLD structures cannot be formed separately for each circuit.

In addition, the length of the low concentration impurity region (n−region or p−region) in a GOLD structure is basically determined by a region in which only the first layer of the gate electrode film, formed by an etching technique such as side etching, exists. Problems such as a restriction developing in the length of the low concentration impurity region (n−region or p−region), and an inability to sufficiently secure the length, therefore develop.

SUMMARY OF THE INVENTION

An object of the present invention is to provide a method of manufacturing a semiconductor device capable of solving the above problems.

A pattern having a function of lowering the intensity of exposure light is established in edge potions of one side, or both sides, of a mask pattern used for forming a gate electrode in a photomask, or in a reticle, for forming the gate electrode used by a photolithography process. (This pattern is referred to as a supplemental pattern within this specification.) A diffraction grating pattern having a slit portion composed of lines and spaces below the limit of image resolution of exposure apparatus, and a translucent film for lowering the transmittivity of the exposure light, can be considered as specific patterns for the supplemental pattern having the capability of reducing the intensity of exposure light. The intensity of transmitted light can be regulated by controlling the pitch and the slit width of a slit (space) portion when the diffraction grating pattern is used. On the other hand, the intensity of the light transmitted can be regulated by controlling the transmittivity of the translucent film when the translucent film is used.

Further, another structure of the present invention may be structured such that the transmittivity of the supplemental pattern is not uniform, but rather has a gradient; the transmittivity is proportional to the distance from the mask pattern used for forming the gate electrode, and increases gradually with closeness to the high concentration impurity region. It is possible to regulate the intensity of the transmitted light by changing the pitch and the slit width of the slit portion in the diffraction grating pattern, and this is a structure in which the slit width gradually becomes larger because the transmittivity increases in proportion to distance from the edge portions of the mask pattern for forming the gate electrode. Furthermore, it is possible to regulate the intensity of the transmitted light by changing the film thickness or the transmittivity of the translucent film itself when a translucent film is used, and the film thickness of the translucent film becomes gradually thinner, or the transmittivity of the translucent film itself gradually increases, in proportion to distance from the edge portions of the mask pattern used for forming the gate electrode.

Negative type resist is difficult to apply as the resist used by the photolithography processes in the present invention, and therefore it is assumed that the structure of the photomask or the reticle pattern used for formation of the gate electrode is a positive type resist.

Note that the term positive resist denotes a type of resist in which regions exposed to exposure light are soluble in developer liquid. The term negative resist denotes a type of resist in which regions exposed to exposure light are not soluble in developer liquid.

When performing exposure of light using the photomask or the reticle for forming the gate electrode, regions of the main pattern of the pattern for forming the gate electrode are light shielding portions and therefore the light intensity is zero. Regions on the outside of the supplemental pattern are light transmitting portions, and therefore the light intensity is 100%. On the other hand, the intensity is regulated within a range from 10 to 70% in the supplemental pattern region, which is the boundary region between the light shielding portions and the light transmitting portions. The resist film thickness after development in edge portions on one side, or on both sides, of the resist pattern is then formed thinner within a range from 10 to 60% compared to the normal resist film thickness, in accordance with applying a photolithography process to the photomask or the reticle used for forming the gate electrode. A convex shape resist pattern is therefore formed for cases in which the edge portions of both sides of the resist pattern are formed thinner. Further, for cases in which the transmittivity of the supplemental pattern is not uniform, but rather has a gradient, the film thickness in the edge portions of one side, or of both sides, of the resist pattern after development are formed thinner within a range of 10 to 60% compared to the normal thickness. The resist pattern is formed with a resist pattern shape having a tapered region in which the film thickness of the resist becomes gradually thinner with closeness to the edge portions.

It is thought that if single wavelength exposure using a reduction exposure apparatus such as a stepper is applied to the translucent film as a supplemental pattern, then the translucent film will act as a half tone phase shifter because the phase of the exposure light is partial coherent light having a certain amount of alignment. In this case, it is necessary to be careful to regulate the film thickness of the translucent film such that the phase between adjacent exposure lights does not invert on the order of 180° C. It should be regulated to be on the order of 360° C., if possible. The film thickness of the translucent film is therefore regulated in consideration of both the phase shift amount and the transmittivity when applying the translucent film as the supplemental pattern for cases of a reticle to which the reduction projection exposure apparatus is applied.

Further, it has already been stated that it is assumed that only a positive type resist is used in the photolithography process steps of the present invention, and the reason for this is explained here. In contrast to the case of positive resist, the main pattern regions of the photomask used for forming the gate electrode and the reticle are light transmitting regions, and the region on the outside of the supplemental patterns are shield regions if negative resist is used, and the supplemental pattern region becomes a pattern structure of a light intensity regulating portion (regulating light intensity in a range on the order of 10 to 70%). For cases in which negative resist is exposed using a photomask or a reticle having this pattern structure, a sufficient exposure energy necessary for forming resist pattern is not irradiated to the supplemental pattern region, and therefore this becomes a state in which only the upper layer portion of the resist film is exposed. The lower layer portion is in a state of no light exposure, or a state in which the light exposure is insufficient. The upper layer of the resist film of corresponding regions is insoluble in developer liquid for cases in which the negative resist is developed in this state, while the lower layer portion is soluble in developer liquid. A good pattern therefore cannot be formed where only the lower layer portion is taken as the resist residual film.

It is thus difficult to apply negative resist in the photolithography process steps of the present invention, and only positive resist is used.

A first structure of the invention disclosed in this specification is characterized by comprising the steps of:
    forming a conductive, film on a semiconductor layer, through an insulating film;

forming a resist pattern having a thin film thickness region in its edge portions, using a photomask, or a reticle, having a diffraction grating pattern, on the conductive film;

forming the gate electrode having a thin film thickness region in its edge portions using the resist pattern by performing dry etching; and injecting an impurity element into the semiconductor layer with the gate electrode as a mask, forming: a first impurity region on the outside of the gate electrode; and a second impurity region overlapping with the thin film thickness region of the gate electrode.

A resist pattern is formed in the above step of forming a resist pattern in which the film thickness of the edge portions of one side, or both sides, of the resist film become thinner.

Dry etching is performed in the step of forming the gate electrode. In the process of dry etching, regions in which the resist film thickness of the edge portions of the resist pattern are formed thinner are gradually etched due to a problem of selectivity between the gate electrode film and the resist film, and the gate electrode film below is exposed during dry etching. Etching of these regions of the gate electrode film proceeds from this point, and the remaining film thickness of these regions of the gate electrode film becomes on the order of 5 to 30% of the predetermined film thickness. A gate electrode structure is thus formed having regions in which the edge portions of one side, or both sides, of the gate electrode are thinner.

A high concentration impurity regions (n+region or p+region) which becomes a source region and a drain region are formed in the lower layer regions corresponding, to the outside of the gate electrode by ion injection of an n-type impurity or a p-type impurity, with the gate electrode as a mask, in the step of injecting an impurity element. A low concentration impurity region (n−region or p−region) is formed in the lower layer regions corresponding to the region of the gate electrode which has become thinner, one side or both sides of the gate electrode film. Considering the different film thickness of the gate electrode, the high concentration impurity region (n+region or p+region) and the low concentration region (n−region or p−region) can be formed at the same time by appropriately selecting the acceleration voltage and the ion injection amount during ion injection.

A definition of the term referred to as ion injection is clarified here. The general wisdom is that the term ion injection is applied for cases in which an impurity ion which undergoes mass separation is added, and that the term ion doping is applied for cases in which an impurity ion that does not undergo mass separation is added. There is no particular distinction placed on the terms ion injection and ion doping in this specification, and the addition of an impurity ion is referred to as ion injection without regard to whether there is mass separation.

A second structure according to the invention disclosed in this specification is characterized by comprising the steps of:
forming a conductive film on a semiconductor layer, through an insulating film;
forming a resist pattern having a thin film thickness region in its edge portions using a photomask, or a reticle, having means for reducing the intensity of light, on the conductive film;
forming a gate electrode having a thin film thickness region in its edge portions using the resist pattern, by performing first dry etching;
injecting an impurity element into the semiconductor layer with the gate electrode as a mask, forming: a first impurity region on the outside of the first gate electrode; and a second impurity region overlapping with the region of the gate electrode having a thin film thickness; and
making the edge portions of the gate electrode recede by performing second dry etching.

A resist pattern used for forming the gate electrode and which has tapered shape regions in which the resist film thickness becomes thinner with closeness to edge portions of the pattern on one side, or on both sides, of the resist pattern are formed in the above step of forming the resist pattern.

A first dry etching is performed in the step of forming the gate electrode. The resist film is gradually etched due to the problem of selectivity between the gate electrode film and the resist film in accordance with the dry etching process over a predetermined time, and the gate electrode film underneath is gradually exposed, from the regions having a thin resist film thickness in the edge portions of the resist pattern of the tapered shape regions. Etching of the gate electrode film proceeds from the edge portions of these regions. A gate electrode structure having a tapered shape region in which the film thickness of the gate electrode becomes thinner with proximity to the edge portions of one side, or both sides, of the gate electrode is thus formed after dry etching is performed such that the film thickness of the corresponding regions of the gate electrode become on the order of 5 to 30% of the initial film thickness. Note that a gate insulating film exposed from the gate electrode is dry etched, and becomes thinner by a certain extent.

A high concentration impurity regions (n+region or p+region) which becomes a source region and a drain region are formed in a polycrystalline silicon film, or in a semiconductor substrate, corresponding to the outside of the gate electrode by high concentration ion injection of an n-type impurity element or a p-type impurity element, with the gate electrode as a mask, in the step of injecting the impurity element. A low concentration impurity region (n−region or p−region) is formed in the polycrystalline silicon film, or in the semiconductor substrate, corresponding to the tapered shape regions in which the gate electrode film becomes thinner on one side, or both sides, of the gate electrode. Considering the different film thickness of the gate electrode, the high concentration impurity region (n+region or p+region) in the polycrystalline silicon film, or in the semiconductor substrate, corresponding to the regions on the outside of the gate electrode, and the low concentration impurity region (n−region or p−region) in the polycrystalline silicon film, or in the semiconductor substrate, corresponding to the tapered shape regions in which the gate electrode film becomes thinner in the edge portions of the gate electrode, can be formed at the same time by appropriately selecting the acceleration voltage and the ion injection amount during ion injection. Note that, in the tapered shape region of the edge portions of the gate electrode, the film thickness of the gate electrode gradually becomes thinner with closeness to the edge portions of the gate electrode, and therefore a concentration gradient exists in the impurity concentration of the low concentration impurity region (n−region or p−region) which is ion injected by through doping. The impurity concentration has a gradient such that gradually becomes higher with proximity to the edge portions of the gate electrode, namely the source region and the drain region.

A second dry etching is performed in the fifth step. The tapered shape portions of the gate electrode edge portions are dry etched by this dry etching process performed for a predetermined amount of time. As a result, the film thickness of the tapered shape regions of the gate electrode becomes additionally thinner, and edge portions of the gate electrode, which are the edge portions of the tapered shape region, are receded. The low concentration impurity region (n−region or p-region) having the concentration gradient is therefore segregated into a region which overlaps with the gate electrode (defined as an Lov region), and a region which does not overlap with the gate electrode (defined as an Loff region). The size of the gate electrode can be freely regulated within the extent of the tapered shape region by appropriately changing the dry etching process conditions at this point. Namely, the size of the Lov region and the size of the Loff region can be freely determined within the range of the extent of the tapered shape region. Further, the gate insulating film underneath which is exposed from the gate electrode becomes additionally thinner by the second dry etching. The unnecessary resist pattern which is a dry etching mask of the gate electrode is removed afterward.

Note that the Lov region is known to be an effective measure against hot carriers, and that the Loff region is known to be effective in controlling the off current. The transistor formed here is a GOLD structure transistor which is effective against hot carriers, and has the Loff region which is effective in controlling the off current. An off current suppression effect of a certain extent can therefore be expected. If the discussion is limited to the control effect of the off current, however, then the LDD structure transistor described subsequently is more effective.

A method of forming a GOLD structure transistor is recorded above, but there are many types of circuits contained in a semiconductor device, and although there are cases in which GOLD structure, transistors, which have a superior hot carrier countering effect, are suitable, there are also cases in which LDD structure transistors, which have a small off current value, are appropriate, depending upon the circuit type. Further, there are cases in which single drain structure transistors are suitable, depending upon the circumstances. A method for forming GOLD structure, LDD structure, and single drain structure transistors separately for each circuit is therefore stated below.

First, a process for forming GOLD structure and LDD structure transistors separately for each circuit can be possible by changing the processes from the ion injection step in a first structure of the present invention. After the dry etching process is complete, a low concentration impurity region (n−region or p−region) is formed in the region of the lower layer corresponding to the outside of the gate electrode by performing a first ion injection. The resist pattern used as a dry etching mask when forming the gate electrode is removed next. Note that the removal of the resist pattern may also be performed before performing the first ion injection process. A new resist pattern is then formed in a region for forming an LDD structure so as to cover the gate electrode. A high concentration impurity regions (n+region or p+region), which becomes a source region and a drain region, are then formed by performing a second ion injection process.

The high concentration impurity regions (n+region or p+region) which becomes a source region and a drain region are formed in the lower layer region, corresponding to the region exposed from the resist pattern, in the LDD structure formation region by ion injection with the resist pattern covering the gate electrode as a mask. The low concentration impurity region (n−region or p−region) is already formed in the region of the lower layer corresponding to the region on the outside of the gate electrode and inside of the resist pattern by the first ion injection process, and the LDD structure transistor is formed by forming the high concentration impurity region (n+region or p+region).

On the other hand, in a region for forming a GOLD structure, a high concentration impurity region (n+region or p+region) which becomes a source region and a drain region are formed in a region of the lower layer corresponding to a region exposed from the gate electrode, by performing ion injection with the gate electrode as a mask. At the same time, a low concentration impurity region (n−region or p−region) is formed in a region of the lower layer corresponding to a region of the gate electrode film on one side, or on both sides, of the gate electrode and which becomes thinner. Considering the different film thicknesses in the edge of the gate electrode, the GOLD structure transistor can be realized by forming the high concentration impurity region (n+region or p+region) and the low concentration impurity region (n−region or p−region) at the same time by appropriately selecting the acceleration voltage and the ion injection amount during ion injection.

Note that the low concentration impurity is already injected in the region exposed from the gate electrode by the first injection step, and that the high concentration impurity is injected on top of that by the second ion injection step. However, there are no particular impediments in the formation of the high concentration impurity regions (n+region) which becomes a source region and a drain region. The resist pattern used for forming the LDD structure formation region is then removed.

Next, a method of forming a single drain structure transistor is stated below. The single drain structure transistor formation is easy, and it becomes possible to form a the single drain structure transistor if a supplemental pattern having a light intensity reducing function is not formed in a photomask, or a reticle, used for forming the gate electrode. The resist pattern used for forming the gate electrode and the gate electrode are each formed in a rectangular shape for cases in which the supplemental pattern having a function of reducing the intensity of light is not formed, and therefore the low concentration impurity region (n−region or p−region) and the high concentration impurity region (n+region or p+region) which are injected by the first ion injection step and the second ion injection step overlap by a region of the lower layer corresponding to the outside of the gate electrode, and a single drain structure transistor is formed. The rectangular shape referred to in the present invention is not necessarily limited to the shape having four right angles but it may include a trapezoid shape. Further, it also includes a somewhat deformed rectangular shape and a somewhat deformed trapezoid shape.

By combining the methods of forming the GOLD structure and LDD structure transistors, already stated, with the above method of forming the single drain structure transistor, it becomes possible to form the GOLD structure, LDD structure, and single drain structure transistors separately for each circuit.

Further, a method of forming GOLD structure and LDD structure transistors separately for each circuit is explained in the second structure of the present invention. A resist pattern used for forming gate electrodes is formed first. A supplemental pattern having a function of reducing the intensity of light is set in a mask pattern used for forming the gate electrodes, corresponding to the GOLD structure formation region and to the LDD structure formation region, in a suitable photomask or reticle. A supplemental pattern is not set into a mask pattern used for forming a gate electrode corresponding to a single drain structure formation region. As a result, tapered shape regions in which the resist film thickness gradually becomes thinner with closeness to edge portions are formed in the resist patterns of the GOLD structure formation region and the LDD structure formation region, and a rectangular shape resist pattern, in which the tapered shape region does not exist, is formed in the resist pattern of the single drain structure formation region.

Note that the size of the tapered shape regions in the resist patterns of the GOLD structure formation region and the LDD structure formation region are formed with appropriate lengths by regulating the size of the supplemental pattern region of the mask pattern in consideration of the size of the low concentration impurity region in the completely formed GOLD structure and LDD structure transistors. It is possible to freely set the size of the low impurity regions (n−region or p−region) of the GOLD structure and the LDD structure transistors at this point by regulating the size of the supplemental pattern regions set in each of the corresponding mask patterns. Further, the film thickness of the tapered shape regions in the resist patterns of the gold structure formation region and the LDD structure formation region can be formed with appropriate resist film thicknesses (in a range of 10 to 60% with respect to the initial film thickness) by regulating the transmittivity of the supplemental patterns region set into each of the corresponding mask patterns within a range of 10 to 70%.

A first dry etching process is performed next. Gate electrodes having tapered shape regions, in which the gate electrode film thickness becomes thinner with proximity to edge portions of one side, or both sides, of the gate electrode, are formed in the GOLD structure formation region and in the LDD structure formation region in accordance with the dry etching process which has a predetermined time. On the other hand, a rectangular shape gate electrode is formed in the single drain structure formation region.

High concentration ion injection of an n-type impurity is performed with the gate electrodes as masks. In the GOLD structure formation region and the LDD structure formation region, high concentration impurity regions which become source regions and drain regions are formed in a polycrystalline silicon film, or a semiconductor substrate, corresponding to the outside of the gate electrodes. A low concentration impurity region (n−region) is formed in the polycrystalline silicon film, or in the semiconductor substrate, corresponding to the tapered shape region in which the film thickness of the gate electrode is thin. On the other hand, only a high concentration impurity region (n+region or p+region) which becomes a source region and a drain region is formed in the single drain structure formation region.

A second dry etching process is performed next. The tapered shape regions of the edge portions of the gate electrode in the GOLD structure formation region are dry etched in accordance with the dry etching process performed for a predetermined amount of time, and the thickness of the gate electrode film becomes additionally thinner in the tapered shape regions. The edge portions of the tapered shape regions, namely the gate electrode edge portions, recede. After performing the dry etching process until the edge portions of the gate electrode recede by a certain amount, the low concentration impurity region (n−region) is segregated into an Lov region which overlaps with the gate electrode, and an Loff region which does not overlap with the gate electrode. The tapered shape regions of the gate electrode in the LDD structure formation region are also dry etched in a manner similar to the GOLD structure formation region. On the other hand, although the gate electrode of the single drain structure formation region is also similarly dry etched, the gate electrode has a rectangular shape, and therefore only the gate insulating film underneath additionally etched. The unnecessary resist patterns which are used as dry etching masks of the gate electrodes are then removed.

Note that, at the state at which the second dry etching process, and the removal of the resist patterns used as dry etching masks, are completed, there are cases in which the tapered shape regions of the gate electrode in the LDD structure formation region remain, and cases in which they disappear. Subsequent processing steps change accordingly, and are stated separately below.

For cases in which the tapered shape regions of the gate electrode in the LDD structure formation region remain after performing dry etching for a predetermined amount of time in the second dry etching step, it is necessary to remove the tapered shape regions by selective dry etching. A third dry etching process is therefore performed after forming a new resist pattern so as to only leave open the LDD structure formation region. The tapered shape regions are selectively removed in accordance with the dry etching process performed for a predetermined amount of time, and a rectangular shape gate electrode is formed. As a result, an LDD stricture transistor is formed having the low concentration impurity region (n−region or p−region) and the high concentration impurity region (n+region or p+region) in a polycrystalline silicon film, or in a semiconductor substrate, corresponding to the outside of the gate electrode. The dry etching mask resist pattern is then removed.

On the other hand, for cases in which the tapered shape regions of the gate electrode in the LDD stricture formation region have disappeared after performing dry etching for a predetermined amount of time in the second dry etching step, formation of the resist pattern such that only the LDD structure formation region is left open, and the third dry etching process, are unnecessary. In this case, formation of the LDD structure transistor is already complete at the state where the second dry etching process and the removal of the dry etching mask resist pattern are complete.

In accordance with the above process of manufacture, GOLD structure, LDD structure, and single drain structure transistors can be formed separately for each circuit of a semiconductor device.

Also, a feature of the present invention resides in a method of manufacturing a semiconductor device comprising the steps of:
    forming a conductive film over a semiconductor with an insulating film therebetween;
    forming a resist pattern on the conductive film, wherein a thickness of an edge portion of the resist pattern is smaller than thickness of a middle portion of the resist pattern;
    forming a gate electrode by a first etching using the resist pattern wherein a thickness of an edge portion of the gate electrode is smaller than a thickness of a middle portion of the gate electrode;
    introducing an impurity element into the semiconductor with the gate electrode as a mask to form a first impurity region and a second impurity region in the semiconductor, wherein the first impurity region is not overlapped with the gate electrode and the second impurity region is overlapped with the edge portion of the gate electrode; and
    making the edge portion of the second gate electrode recede by a second etching. The resist pattern having the thin edge portion is formed on the conductive film by using a photomask having a diffraction grating pattern or a reticle having a diffraction grating pattern, alternatively, by using a photomask having a translucent film portion or a reticle having a translucent film portion.

The present invention is one in which it is possible to manufacture a semiconductor device, composed of GOLD structure transistors, simply and in accordance with application of a photomask, or a reticle, used for forming a gate electrode, to a photolithography process, and through etching and ion injection processes. The gate electrode is one on which a supplemental pattern, having a function for reducing the intensity of light, is set in a mask pattern.

It is possible to arbitrarily set the transmittivity and the size of the light intensity reducing means, and therefore the film thickness and the size of the tapered shape region in which the film thickness of the edge portions of the gate electrode, formed though photolithography processing and dry etching processing, becomes thin, can be regulated. Consequently, it becomes possible to optimize the concentration distribution of the low concentration impurity region (n−region or p−region) which is ion injected by doping through the tapered shape region, and the size in the channel direction. The capabilities of the GOLD structure and LDD structure transistors can therefore be increased.

Further, the ion injection processing is divided into two steps in the manufacture of the semiconductor device composed of the GOLD structure transistors. By changing the processing so that the low concentration impurity first ion injection process is performed, and then performing the high concentration impurity second ion injection process after forming the resist pattern so as to cover the gate electrode only in the LDD structure formation region, it becomes possible to form LDD structure and GOLD structure transistors separately for each circuit.

Further, it becomes possible to form single drain structure and GOLD structure transistors separately for each circuit pattern of the semiconductor device in accordance with establishing the supplemental pattern, having a function of reducing the intensity of light, in an arbitrary mask pattern in a photomask, or a reticle, used for forming the gate electrode.

It is possible to establish the means for reducing the intensity of light in an arbitrary mask pattern, and therefore GOLD structure, LDD structure, and single drain structure transistors can be formed with ease in each of the circuits of the semiconductor device.

BRIEF DESCRIPTION OF THE DRAWINGS

In the accompanying drawings:

FIGS. 5A and 5B are a method of manufacturing a liquid crystal display by utilizing a photomask, or a reticle, used for forming a gate electrode in which a supplemental pattern having a function of reducing the intensity of light is set (1);

FIGS. 6A and 6B are the method of manufacturing a liquid crystal display by utilizing a photomask, or a reticle, used for forming a gate electrode in which a supplemental pattern having a function of reducing the intensity of light is set (2);

FIGS. 7A and 7B are the method of manufacturing a liquid crystal display by utilizing a photomask, or a reticle, used for forming a gate electrode in which a supplemental pattern having a function of reducing the intensity of light is set (3);

FIGS. 8A and 8B are the method of manufacturing a liquid crystal display by utilizing a photomask, or a reticle, used for forming a gate electrode in which a supplemental pattern having a function of reducing the intensity of light is set (4);

FIGS. 11A to 11E are a method of forming GOLD structure, LDD structure, and single drain structure polycrystalline silicon TFTs for different circuits by utilizing a photomask, or a reticle, used for forming a gate electrode in which a supplemental pattern having a function of reducing the intensity of light is set;

FIGS. 14A and 14B are the method of manufacturing a liquid crystal display by utilizing a photomask, or a reticle, used for forming a gate electrode in which a supplemental pattern having a function of reducing the intensity of light is set (2);

FIGS. 15A and 15B are the method of manufacturing a liquid crystal display by utilizing a photomask, or a reticle, used for forming a gate electrode in which a supplemental pattern having a function of reducing the intensity of light is set (3);

FIGS. 19A to 19D are diagrams for explaining examples of semiconductor devices;

DETAILED DESCRIPTION OF THE PREFERRED EMBODIMENTS

Embodiment Mode 1

A case of applying a photolithography process that utilizes a photomask, or a reticle, for forming a gate electrode having a function of reducing the intensity of light and which is made from a diffraction grating pattern or a translucent film, for forming GOLD structure polycrystalline silicon TFT, is stated based on FIGS. 1A to 1E and FIGS. 2A to 2C.

First, a structure of a photomask, or a reticle, used for forming a gate electrode and in which is set a supplemental pattern made from a diffraction grating pattern, or a translucent film, and which has a function of reducing the intensity of light, is explained using FIGS. 1A to 1E.

Figure 1A:
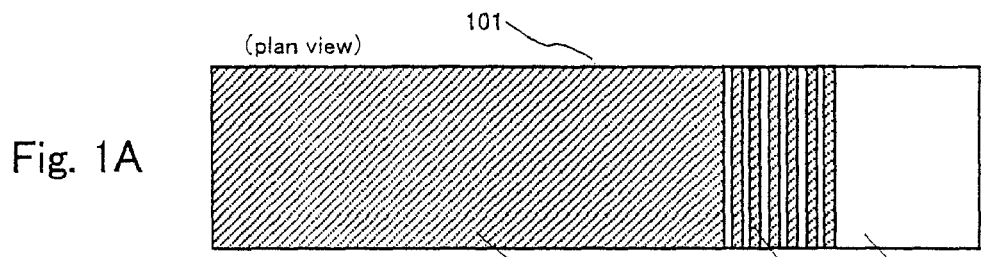
FIGS. 1A to 1E are structures of photomask or reticle mask patterns used for forming a gate electrode and in which a supplemental pattern, having a function of reducing the intensity of light and made from a diffraction grating pattern or a translucent film, is set.
Figure 1B:
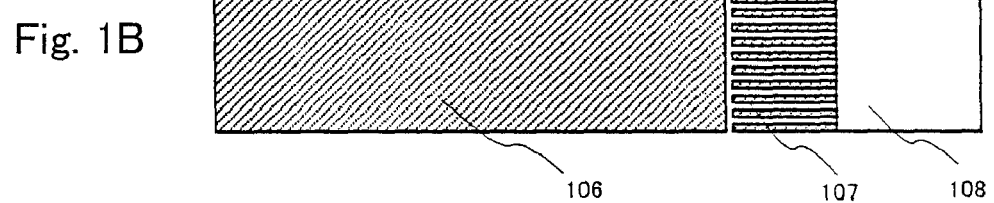
Figure 1C:
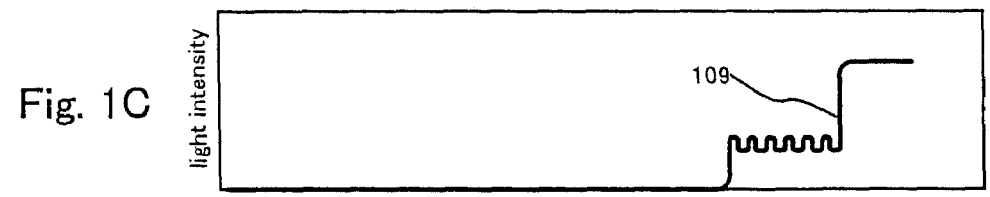

A supplemental pattern having a function of reducing the intensity of light is established in edge portions of one side, or both sides, of a mask pattern in a photomask, or a reticle, used for forming a gate electrode. Examples of a diffraction grating pattern having a slit portion composed of lines and spaces below the limit of resolution are shown in FIGS. 1A and 1B as specific examples of a supplemental pattern. Note that it is difficult to apply negative type resist for the resist used by this photolithography process, and therefore the pattern structures of photomasks, or reticles, 101 and 105 used forming a gate electrode are assumed to be positive type resist. This becomes a pattern structure in which regions of the main pattern of the mask pattern used for forming the gate electrode are therefore light shielding portions 102 and 106, regions of the supplemental pattern having a function of reducing the intensity of light are slit portions 103 and 107, and regions of the outside of the supplemental pattern are light transmitting portions 104 and 108. The direction of the slits of the slit portion may be parallel to the direction of the main pattern (the light shielding portion 102) as with the slit portion 103, and may also be perpendicular to the direction of the main pattern (the light shielding portion 106) as with the slit portion 107. (See FIGS. 1A and 1B.)

When irradiating exposure light to the photomasks, or reticles, 101 and 105 used for forming the gate electrode, the light intensity of the light shielding portions 102 and 106 is zero, and the light intensity of the light transmitting portions 104 and 108 is 100%. On the other hand, the light intensity of the supplemental pattern having a function of reducing the intensity of light and structured by the slit portions 103 and 107 of the diffraction grating patterns composed of lines and spaces below the limit of image resolution of exposure apparatus can be regulated within a range from 10 to 70%. An example of a typical light intensity distribution is shown in a light intensity distribution 109. Control of the light intensity of the slit portions 103 and 107 in the diffraction grating patterns is realized in accordance with regulating the pitch and the slit width of the slit portions 103 and 107. (See FIG. 1C.)

Figure 1D:
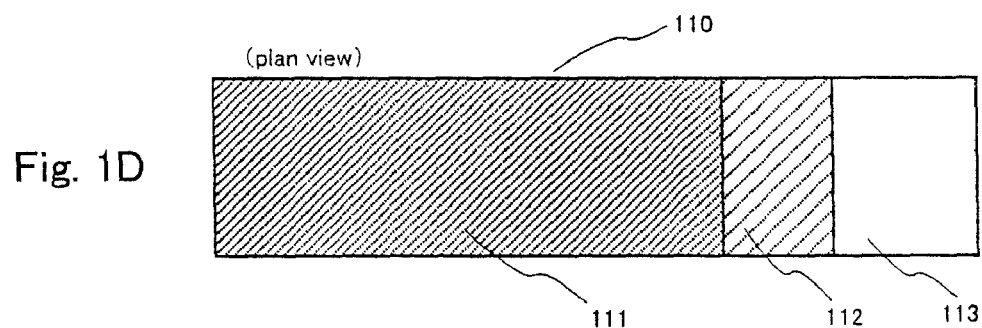
Figure 1E:

Next, an example of a translucent film having a function of reducing the intensity of exposure light is shown in FIG. 1D as a specific example of a supplemental pattern. A region of the main pattern of a mask pattern, used for forming a gate electrode, in a photomask or reticle 110 used for forming the gate electrode is a light shielding portion 111. A region of the supplemental pattern having a function of reducing the intensity of light is a translucent portion 112 composed of the translucent film, and a region on the outside of the translucent portion 112 is a light transmitting portion 113. (See FIG. 1D.)

When exposure light is irradiated to the photomask or reticle 110 used for forming the gate electrode, the light intensity of the light shielding portion 111 and the light transmitting portion 113 are zero and 100%, respectively. The light intensity of the supplemental pattern region structured by the translucent portion 112 composed of the translucent film can be regulated to be within a range of 10 to 70%, and an example of a typical light intensity distribution is shown in a light intensity distribution 114. (See FIG. 1E.)

Figure 2A:
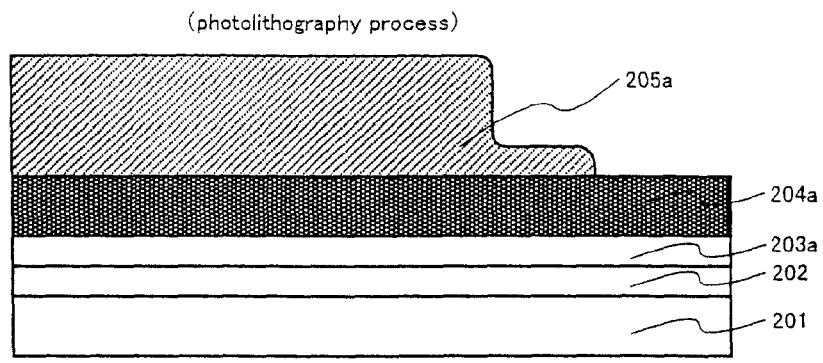
FIGS. 2A to 2C are a method of forming a GOLD structure polycrystalline silicon TFT utilizing a photomask, or a reticle, used for forming a gate electrode in which a supplemental pattern having a function of reducing the intensity of light is set.
Figure 2B:
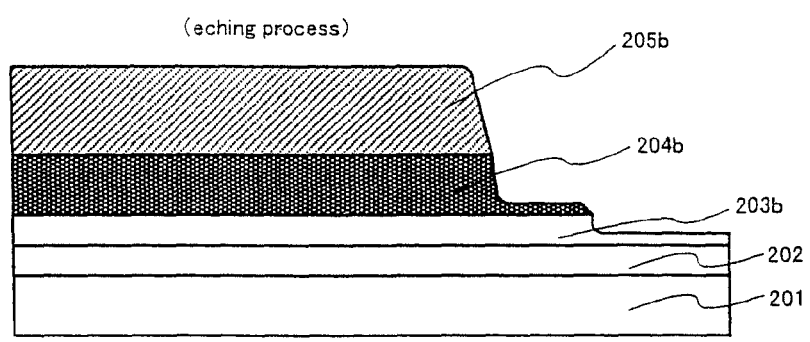
Figure 2C:
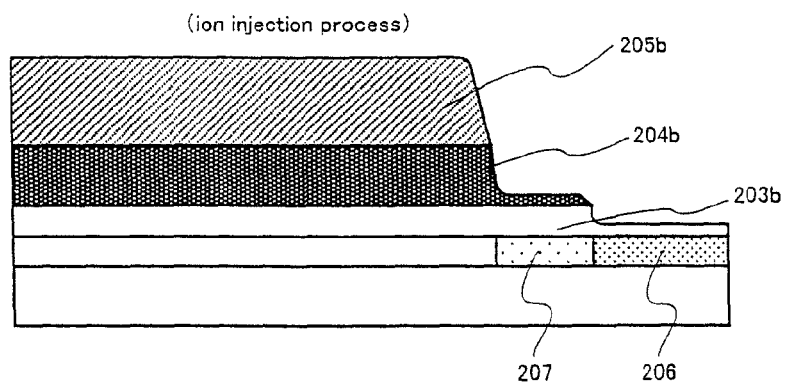
Figure 3A:
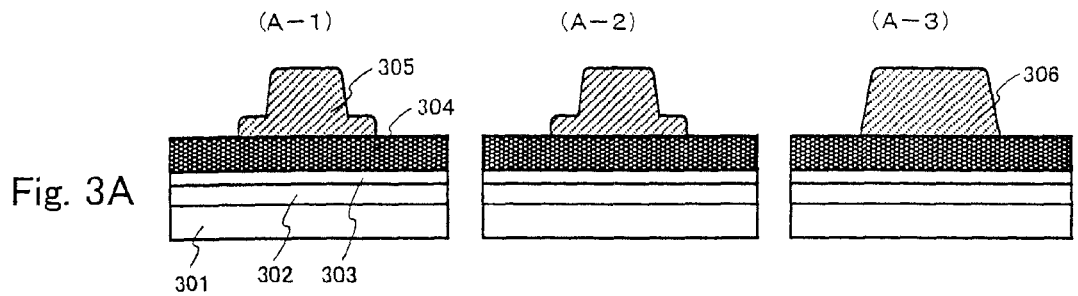
FIGS. 3A to 3D are a method of forming GOLD structure, LDD structure, and single drain structure polycrystalline silicon TFTs for different circuits by utilizing a photomask, or a reticle, used for forming a gate electrode in which a supplemental pattern having a function of reducing the intensity of light is set.
Figure 3B:
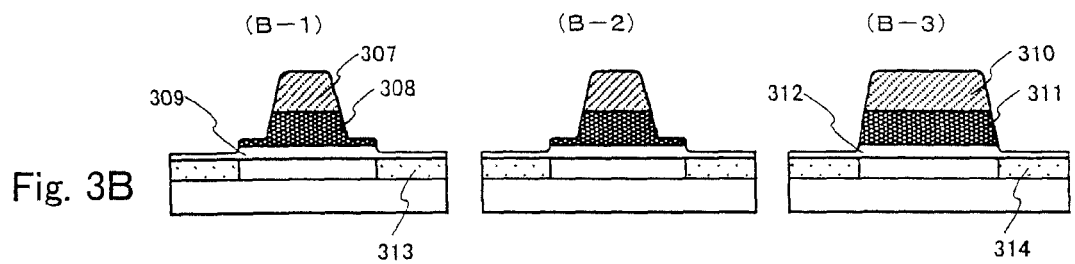
Figure 3C:
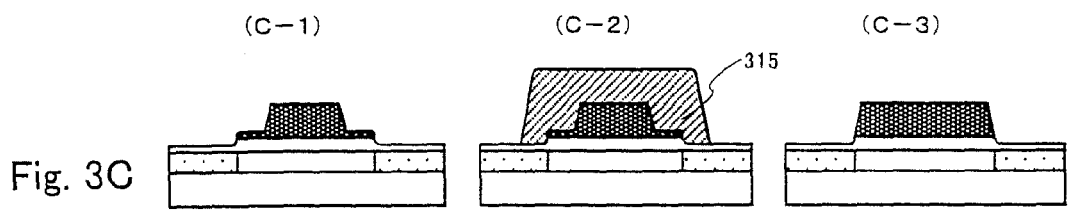
Figure 3D:
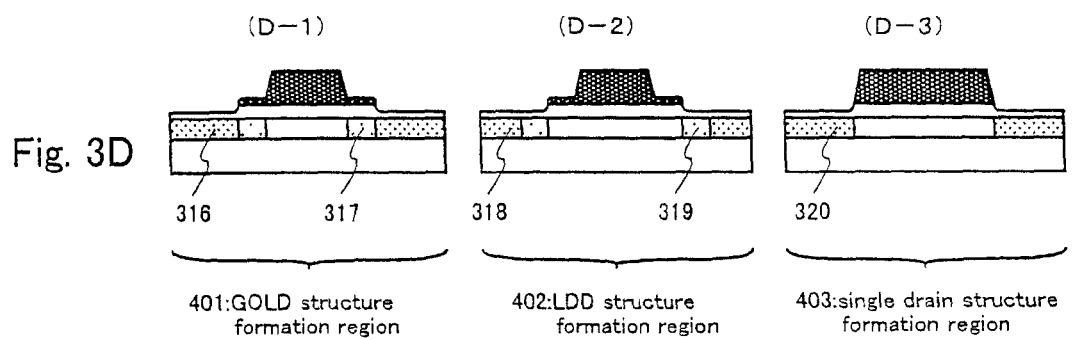

Next, a method of forming a GOLD structure polycrystalline silicon TFT, utilizing the photomasks or reticles 101, 105, and 110 used for forming the gate electrode and having a function of reducing light intensity and composed of a diffraction grating pattern or a translucent film, is explained using FIGS. 2A to 2C.

A resist pattern 205a, which becomes thinner within a range of 10 to 60% compared to the normal resist film thickness after development, is formed in edge portions of one side, or both sides, of a resist pattern by applying the photomasks or reticles 101, 105, and 110, used for forming the gate electrodes, which the supplemental patterns, having a function of reducing the intensity of light, are set and composed of the diffraction gating pattern or the translucent film, to a photolithography process. (See FIG. 2A.)

A dry etching process is performed next with the post development resist pattern 205a as a mask. ICP (inductively coupled plasma) etching is used in embodiment mode 1, and etching is performed with the following etching conditions: $CF_4$ and $Cl_2$ are used as etching gasses, and the specific flow rates of each etching gas are set to 40:40 sccm; a 450 W RF (13.56 MHz) electric power is introduced to a coil shape electrode at a pressure of 1.2 Pa; a 20 W RF (13.56 MHz) electric power is also introduced to a substrate side (test piece stage), and a plasma is generated. Dry etching is performed until the gate electrode film 204a exposed from the post development resist pattern 205a is completely etched in the dry etching step, and until there is a slight over etching of a gate insulating film 203a composed of a silicon oxynitride film existing below. On the other hand, regions in which the film thickness of the resist film becomes thinner in one side, or both sides, of the post development resist pattern 205a are gradually etched due to a problem of selectivity with the gate electrode film 204a, and the resist film of corresponding regions vanishes during dry etching. The gate electrode film 204a below is exposed, and etching of the gate electrode film 204a of corresponding regions proceeds from this state. Etching is performed such that the remaining film thickness becomes a predetermined film thickness from 5 to 30% of the initial film thickness.

The shape of the resist pattern in the dry etching process changes from the post development resist pattern 205a having a regions in which the resist film thickness becomes thinner in one side, or both sides, to a resist pattern 205b after dry etching, finally. A gate electrode 204b having regions in which edge portions of one side, or both sides, of the gate electrode film become thinner is formed by dry etching, and a gate insulating film 203b composed of a silicon oxynitride film and which is a lower layer film existing in regions exposed from the gate electrode 204b becomes a thinner shape due to over etching. (See FIG. 2B.)

Ion injection of a high concentration of an n-type impurity into a source region and a drain region is performed next with the gate electrode 204b as a mask. A high concentration impurity region (n+region) 206, which becomes a source region and a drain region, is formed in a polycrystalline silicon film 202 corresponding to regions exposed from the gate electrode 204b having regions in which the edge portions of one side, or both sides, become thinner. Additionally, a low concentration impurity region (n−region) 207 is formed in the polycrystalline silicon film corresponding to regions in which the film thickness of edge portions of the gate electrode 204b is thin. Considering the different film thicknesses of the gate electrode at this point, the high concentration impurity region (n+region) 206 and the low concentration impurity region (n−region) 207 can be formed at the same time by appropriately selecting the acceleration voltage and the ion injection amount during ion injection. Note that the resist pattern 205b after dry etching may also be removed either before or after the ion injection process. (See FIG. 2C.)

Note also that, although a method of forming a GOLD structure polycrystalline silicon TFT is discussed here, it is of course also possible to apply the photomasks or reticles 101, 105, and 110, used for forming the gate electrodes and, which the supplemental patterns having a function of lowering the intensity of light are set, to the formation of a GOLD structure MOS transistor using a semiconductor substrate such as a silicon substrate. In this case, the high concentration impurity regions (n+region) which become a source region and a drain region, and the low concentration impurity region (n−region) which overlaps with the gate electrode are formed in the semiconductor substrate such as a silicon substrate.

Embodiment Mode 2

Various types of circuits are included in a semiconductor device such as a liquid crystal display, and although there are cases in which a GOLD structure having a superior effect against hot carriers is suitable, there are also cases in which an LDD structure having a small off current value are appropriate. Single drain structures may also be suitable, depending upon the circumstances. It is therefore necessary to form GOLD structure, LDD structure, and single drain structure polycrystalline silicon TFTs separately for each circuit. In embodiment mode 2, a method of totaling GOLD structure, LDD structure, and single drain structure polycrystalline silicon TFTs separately for each circuit is discussed based upon FIGS. 3A to 3D. Note that the photomasks or reticles 101, 105, and 110 used for forming the gate electrodes (see FIGS. 1A, 1B, and 1D) have already been discussed in embodiment mode 1, and therefore an explanation will be omitted here.

Concerning the substrate structure used here, a substrate having a structure in which a polycrystalline silicon film 302 having a predetermined film thickness, a gate insulating film 303 having a predetermined film thickness and formed from a silicon oxynitride film, and a gate electrode film 304 having a predetermined film thickness are each laminated on a glass substrate 301 made from a material such as quartz glass. Photolithography processing is applied to the photomasks or reticles 101, 105, and 110 (see FIGS. 1A, 1B, and 1D) used for forming the gate electrode and in which supplemental patterns have a function of reducing light intensity and is composed of a diffraction grating pattern or a translucent film, and post development resist patterns 305 and 306 used for forming the gate electrodes are formed on the substrate having the above structure. Note that a rectangular shape may also be used for the resist pattern of reference symbol A-2. (See FIGS. 21A to 21D.)

Note that the supplemental pattern having a function of reducing light intensity and composed of the diffraction grating pattern or the translucent film in the mask pattern are established in a GOLD structure formation region 401 and in an LDD structure formation region 402, and therefore the post development resist pattern 305 which become thinner within a range of 10 to 60% compared to the normal resist film thickness in both sides, is formed. On the other hand, the supplemental pattern is not set in the mask pattern in a single drain structure formation region 403, and therefore the post development resist pattern 306 is formed with a normal rectangular shape. (See FIG. 3A.)

A dry etching process is performed next with the post development resist patterns 305 and 306 as masks. A gate electrode film 304 exposed from the post development resist pattern 305 in the GOLD structure formation region 401 and in the LDD structure formation region 402, and the gate electrode film 304 exposed from the post development resist pattern 306 in the single drain structure formation region 403, are each completely etched in the dry etching process. In addition, dry etching is performed until the gate insulating film 303 made from a silicon oxynitride film and existing on the lower layer side is slightly over etched.

In the region where the resist film thickness of the edge portions of both sides of the post development resist pattern 305 in the GOLD structure formation region 401 and in the LDD structure formation region 402 becomes thinner, the resist film is gradually etched due to a problem of selectivity with the gate electrode film 304, and the resist film of corresponding regions vanished during dry etching. The gate electrode film 304 underneath is exposed, and etching of the gate electrode film 304 of the corresponding regions proceeds from this point. Etching is performed so that the remaining film thickness becomes a predetermined film thickness from 5 to 30% of the initial film thickness. The shape of the resist pattern in the dry etching process changes from the post development resist pattern 305 to a post dry etching resist pattern 307, finally. A gate electrode 308 having regions in which the edge portions of both sides of the pattern become thinner is formed in accordance with dry etching, and a gate insulating film 309 composed of the lower layer film silicon oxynitride film existing in the region exposed from the gate electrode 308 becomes thinner in accordance with over etching.

On the other hand, for a case of dry etching in which the post development resist pattern 306 in the single drain structure formation region 403 is used as a mask, the gate electrode film 304, the lower layer film, existing in the region exposed from the resist film is completely etched, and a gate electrode 311 is formed. Further, by performing dry etching until the gate insulating film 303 made from the lower layer film silicon oxynitride film is slightly over etched, a gate insulating film 312 having a shape which becomes thinner due to over etching is obtained. (See FIG. 3B.)

Ion injection of a low concentration of an n-type impurity with the gate electrodes 308 and 311 formed in accordance with dry etching acting as masks, is performed by a first ion injection process, and low concentration impurity regions (n−regions) 313 and 314 are formed in the polycrystalline silicon film 302 corresponding to regions exposed from the gate electrodes 308 and 311. (See FIG. 3B.)

The post etching resist patterns 307 and 310 used as dry etching masks and which become unnecessary are removed next. Note that the removal of the resist patterns 307 and 310 may also be performed before performing the low concentration ion injection process. A resist pattern 315 is then newly formed in the LDD structure formation region 402 so as to cover the gate electrode 308. (See FIG. 3C.)

High concentration ion injection of an n-type impurity is performed by a second ion injection process next. Ion injection is performed with the gate electrode 308 as a mask in the GOLD structure formation region 401 at this point, and a high concentration impurity region (n+region) 316 which becomes a source region and a drain region in the polycrystalline silicon film 702 corresponding to the region exposed from the gate electrode 308 is formed. At the same time, a low concentration impurity region (n−region) 317 is formed in the polycrystalline silicon film 302 corresponding to regions of the gate electrode film existing on both sides of the gate electrode 308 which become thinner. Considering the different film thicknesses of the edge portions in the gate electrode 308, a GOLD structure polycrystalline silicon TFT can be realized by forming the high concentration impurity region (n+region) 316 and the low concentration impurity region (n−region) 317 at the same time by appropriately selecting the acceleration voltage and the ion injection amount during ion injection.

Note that although the low concentration impurity region (n−region) 313 is already formed by the first ion injection process in the region exposed from the gate electrode 308, and that high concentration impurity injection is performed on the low concentration impurity region 313 by the second ion injection process, there are no hindrances in particular in the formation of the high concentration impurity region (n+region) 316 which becomes a source region and a drain region. (See FIG. 3D.)

Further, in the LDD structure formation region 402, a high concentration impurity region (n+region) 318 which becomes a source region and a drain region is formed in the polycrystalline silicon film 302 corresponding to the region exposed from the resist pattern 315 in accordance with ion injection with the resist pattern 315 covered by the gate electrode 308 as a mask. A low concentration impurity region (n−region) 319 is already formed in the polycrystalline silicon film 302 corresponding to a region of the outside of the gate electrode 308, and on the inside of the resist pattern 315, by the first ion injection process, and an LDD structure polycrystalline silicon TFT is structured in combination with the formation of the high concentration impurity region (n+region) 318 by the second ion injection process. (See FIG. 3D.)

Furthermore, in the single drain structure formation region 403, the low concentration impurity region (n−region) 314 is already formed in the polycrystalline silicon film 302 corresponding to the region exposed from the gate electrode 311 by the first ion injection process, and a high concentration impurity region (n+region) 320 is formed so as to overlap with the low concentration impurity region (n−region) 314 by the second ion injection process. A single drain structure polycrystalline silicon TFT is thus formed in which a source region and a drain region are structured by only the high concentration impurity region (n+region) 320. (See FIG. 3D.)

Note that although a method of forming GOLD structure, LDD structure, and single drain structure polycrystalline silicon TFTs separately is discussed here, it is also possible, of course, to form similarly structure MOS transistor using a semiconductor substrate such as a silicon substrate with the photomasks or reticles 101, 105, and 110 used for forming the gate electrodes in which the supplemental patterns having a function for reducing the intensity of light are set. In this case, the high concentration impurity region (n+region) and the low concentration impurity region (n−region) are each formed in the semiconductor substrate, such as a silicon substrate.

Embodiment Mode 3

A case in which a photolithography process, utilizing a photomask or a reticle used for forming a gate electrode having a function of reducing the intensity of light and composed of a diffraction grating pattern or a translucent film, is applied to the formation of a GOLD structure polycrystalline silicon TFT, is discussed based on FIGS. 9A to 9E and 10A to 10C. First, a structure of a photomask, or a reticle, used for forming a gate electrode and in which a supplemental pattern made from a diffraction grating pattern, or a translucent film is set, and which has a function of reducing the intensity of light, is explained using FIGS. 9A to 9E.

Figure 9A:
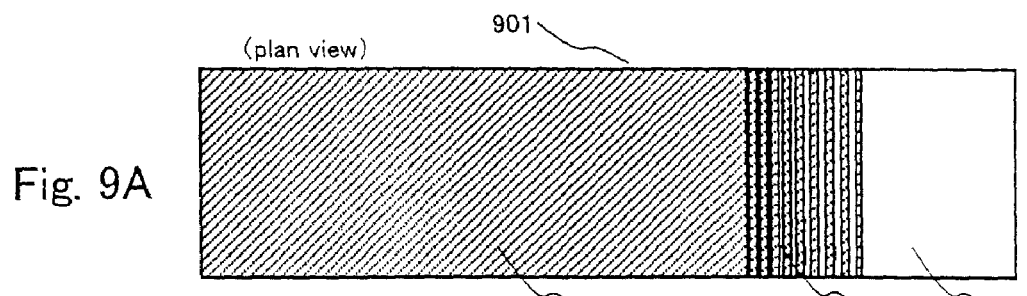
FIGS. 9A to 9E are structures of photomask or reticle mask patterns used for forming a gate electrode in which a supplemental pattern having a function of reducing the intensity of light is set.
Figure 9B:
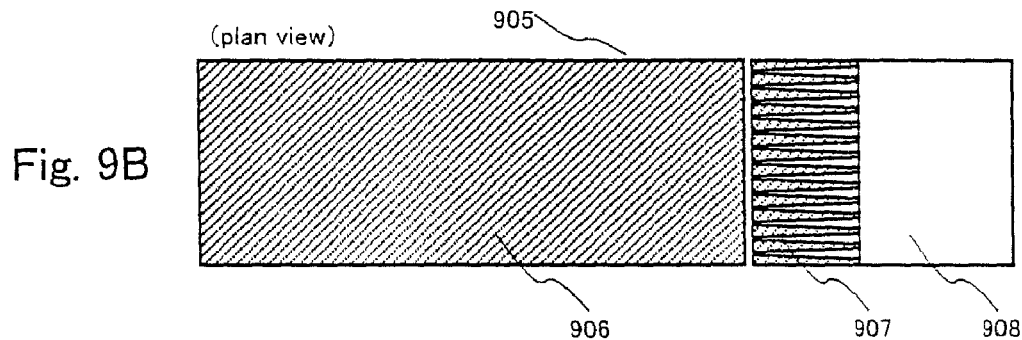
Figure 9C:
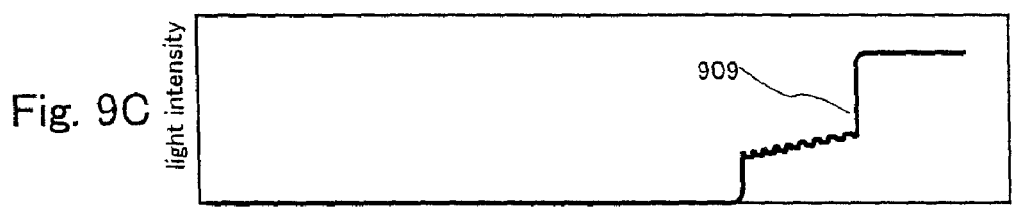

A supplemental pattern having a function of reducing the intensity of light is established in edge portions of one side, or both sides, of a mask pattern in a photomask, or a reticle, used for forming a gate electrode such that transmittivity is gradually increased in proportion to distance from mask pattern. Examples of a diffraction grating pattern having a plurality of slit portions composed of lines and spaces below the limit of image resolution of exposure apparatus are shown in FIGS. 9A and 9B as specific examples of a supplemental pattern. Note that it is difficult to apply negative type resist for the resist used by this photolithography process, and therefore the pattern structures of photomasks, or reticles, 901 and 905 used for forming a gate electrode are assumed to be positive type resist. This becomes a pattern structure in which regions of the main pattern of the mask pattern used for forming the gate electrode are therefore light shielding portions 902 and 906, regions of the supplemental pattern having a function of reducing the intensity of light are slit portions 903 and 907, and regions of the outside of the supplemental pattern are light transmitting portions 904 and 908. The slit direction of the slit portions may be parallel to the direction of the main pattern (light shielding portion 902) as with the slit portion 903, and may also be perpendicular to the direction of the main pattern (light shielding portion 906) as with the slit portion 907. (See FIGS. 9A and 9B.)

When irradiating exposure light to the photomasks, or reticles, 901 and 905 used for forming the gate electrode, the light intensity of the light shielding portions 902 and 906 is zero, and the light intensity of the light transmitting portions 904 and 908 is 100%. On the other hand, the light intensity of the supplemental pattern having a function of reducing the intensity of light and structured by the plurality of slit portions 903 and 907 of the diffraction grating patterns composed of lines and spaces below the limit of image resolution of exposure apparatus can be regulated within a range from 10 to 70% such that transmittivity is increased in proportion to the distance from the mask pattern. An example of a typical light intensity distribution is shown in a light intensity distribution 909. Note that control of the light intensity of the slit portions 903 and 907 in the diffraction grating patterns is realized in accordance with regulating the pitch and the slit width of the slit portions 903 and 907. (See FIG. 9C.)

Figure 9D:
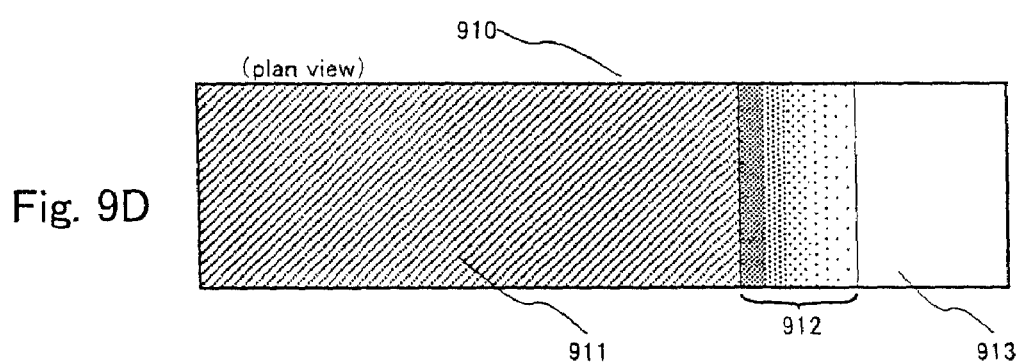
Figure 9E:
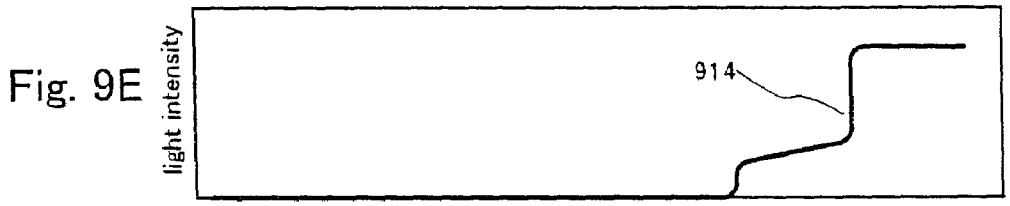

Next, an example of a translucent film having a function of reducing the intensity of exposure light is shown in FIG. 9D as a specific example of a supplemental pattern and it is structured such that the transmittivity of the translucent film is gradually increased in proportion to the distance from the mask pattern. A region of the main pattern of a mask pattern, used for forming a gate electrode, in a photomask or reticle 910 used for forming the gate electrode is a light shielding portion 911. A region of the supplemental pattern having a function of reducing the intensity of light is a translucent portion 912 composed of the translucent film, and a region on the outside of the translucent portion 912 is a light transmitting portion 913. (See FIG. 9D.)

When exposure light is irradiated to the photomask or reticle 910 used for forming the gate electrode, the light intensity of the light shielding portion 911 and the light transmitting portion 913 are zero and 100%, respectively. The light intensity of the supplemental pattern region structured by the translucent portion 912 composed of the translucent film can be regulated to be within a range of 10 to 70% such that transmittivity is increased in proportion to the distance from the mask pattern, and an example of a typical light intensity distribution is shown in a light intensity distribution 914. (See FIG. 9E.)

Figure 10A:
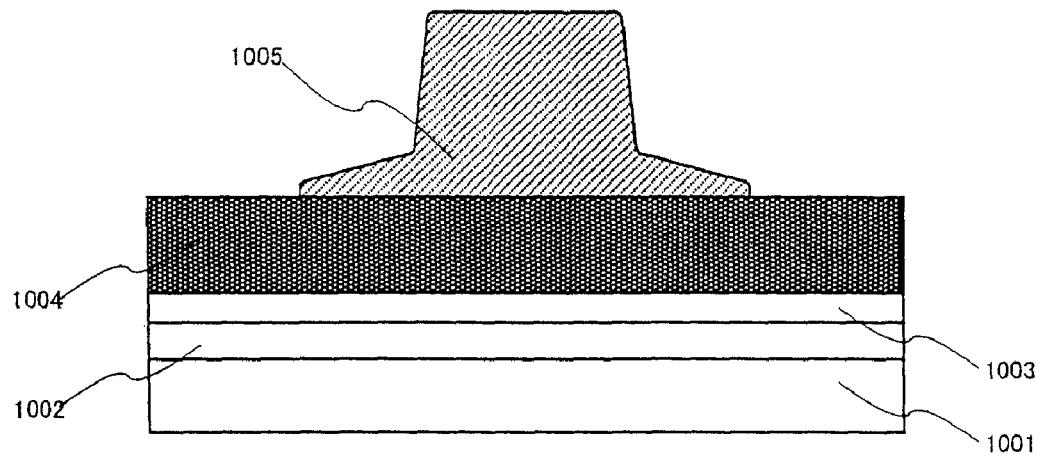
FIGS. 10A to 10C are a method of forming a GOLD structure polycrystalline silicon TFT applying a photomask, or a reticle, used for forming a gate electrode in which a supplemental pattern having a function of reducing the intensity of light is set.
Figure 10B:
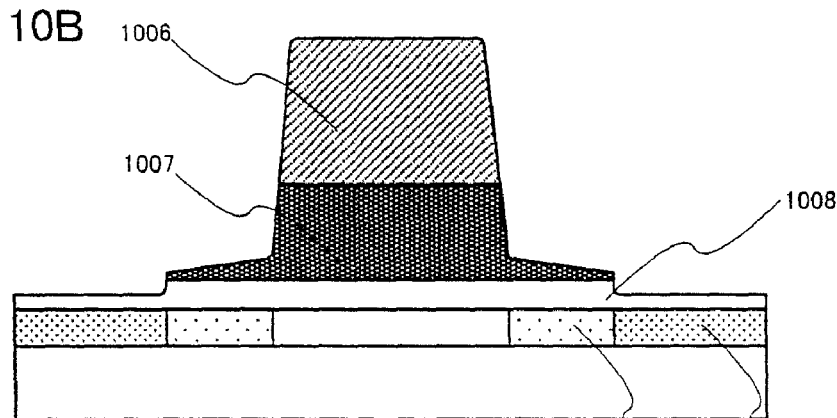
Figure 10C:
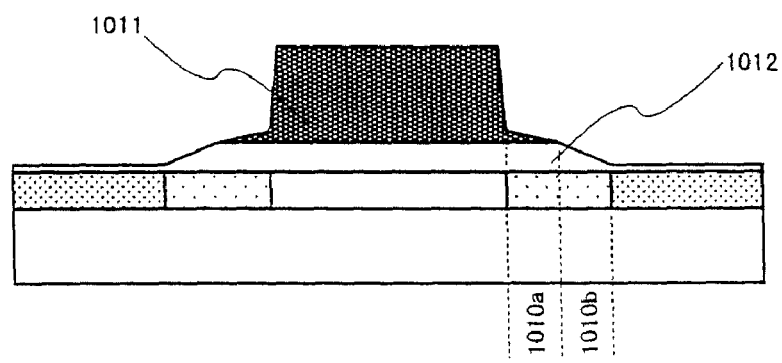

Next, a method of forming a GOLD structure polycrystalline silicon TFT, utilizing the photomasks or reticles 901, 905, and 910 used for forming the gate electrode and having a function of reducing light intensity and composed of a diffraction grating pattern or a translucent film, is explained using FIGS. 10A to 10C.

A post development resist pattern 1005, which is formed thin within a range of 10 to 60% compared to the normal resist film thickness after development and having a tapered shape regions which gradually becomes thinner with closeness to the edge portions, is formed in edge portions of one side, or bath sides, of a resist pattern by applying the photomasks or reticles 901, 905, and 910, used for forming the gate electrodes and in which the supplemental patterns, having a function of reducing the intensity of light is set, and which are composed of the diffraction grating pattern or the translucent film, to a photolithography process. (See FIG. 10A.)

Note that the resist film thickness of the tapered shape regions of the post development resist pattern 1005 becomes thinner with proximity to the edge portions of the tapered shape regions, and that it is possible to freely set the resist film thickness by suitably regulating the transmittivity of the supplemental pattern region set in the corresponding mask pattern. Considering the remaining film thickness of the tapered shape region of the gate electrode formed by subsequent processes, a first dry etching process and a second dry etching process, a suitable resist film thickness is formed in the tapered shape region of the post development resist pattern 1005. Further, it is possible to freely set the size of the tapered shape region of the post development resist pattern 1005 by regulating the size of the supplemental pattern region established in the corresponding mask pattern. An appropriate length is formed for the tapered shape region of the post development resist pattern 1005 considering the size of the low concentration impurity region (n−region) in the final GOLD structure transistor. (See FIG. 10A.)

A first dry etching process is performed next with the post development resist pattern 1005 as a mask. A gate electrode film 1004 exposed from the post development resist pattern 1005 is completely etched in this dry etching process performed for a predetermined amount of time, and in addition, dry etching is performed until a gate insulating film 1003 existing on the lower layer side is slightly over etched. On the other hand, in the tapered shape region in which the resist film thickness becomes thinner in the edge portions of the post development resist pattern 1005, the resist film is gradually etched due to a problem of selectivity between the gate electrode film 1004 and the resist film, and therefore the gate electrode film 1004 below is gradually exposed during etching from the regions in which the resist film thickness of the edge portions of the resist pattern becomes thinner in the tapered shape region, and etching of the gate electrode film 1004 proceed from the edge of the corresponding region. A gate electrode 1007 having a tapered shape region with a structure in which the gate electrode film thickness becomes thinner with proximity to the edge portions of the gate electrode is therefore formed after dry etching such that the remaining film thickness of the corresponding gate electrode film 1004 becomes a predetermined film thickness of approximately from 5 to 30% of the initial film thickness.

The shape of the resist pattern in the first dry etching process changes from the post development resist pattern 1005 having a tapered shape region in which the resist film thickness becomes thinner with closeness to edge portions of the pattern finally to a post dry etching resist pattern 1006. A gate electrode 1007 having tapered shape regions in which the resist film thickness becomes thinner with closeness to a portion of the gate electrode is formed by dry etching, and a gate insulating film 1008 which is a lower layer film existing in regions exposed from the gate electrode 1007 becomes a thinner shape due to over etching. (See FIG. 10B.)

Ion injection of a high concentration of an n-type impurity into a source region and a drain region is performed next with the gate electrode 1007 as a mask. A high concentration impurity region (n+region) 1009, which becomes a source region and a drain region, is formed in a polycrystalline silicon film 1002 corresponding to regions exposed from the gate electrode 1007 having tapered shape regions in which the resist film thickness becomes thinner with closeness to the edge portions of the gate electrode. Further, a low concentration region (n−region) 1010 is formed in the polycrystalline silicon film 1002 corresponding to regions in which the film thickness of edge portions of the gate electrode 1007 is thin. The tapered shape region of the edge portion of the gate electrode 1007 becomes a structure in which it the gate electrode film thickness gradually becomes thinner with closeness to the edge portions of the gate electrode 1007, and therefore a concentration gradient exists in the impurity concentration of the low concentration impurity region (n−region) 1010 which is ion injected by through doping. The impurity concentration tends to gradually become higher with proximity to the edge portions of the gate electrode 1007, namely the edge portions of the source region and the drain region. (See FIG. 10B.)

Note that the injection conditions the in ion injection are a dose amount of $5 \times 10^{14}$ to $5 \times 10^{15}$ atoms/cm$^2$ and an acceleration voltage of from 60 to 100 KV. Further, an impurity is ion injected into the high concentration impurity region (n+region) 1009 on the order of $1 \times 10^{20}$ to $1 \times 10^{22}$ atoms/cm$^3$, and the impurity is injected into the low concentration impurity region (n−region) 1010 on the order of $1 \times 10^{18}$ to $1 \times 10^{19}$ atoms/cm$^3$.

A second dry etching process is performed next with the gate electrode 1007 as a mask. The tapered shape region of the edge portion of the gate electrode 1007 is etched by the dry etching process performed for a predetermined amount of time, the film thickness of the gate electrode of the tapered shape region becomes additionally thinner, and the edge portion of the tapered shape region recedes. As a result, the gate electrode 1007 chancres into a gate electrode 1011, and the low concentration impurity region (n−region) 1010 having a concentration gradient is segregated into an Lov region 1010a which overlaps with the gate electrode 1011, and an Loff region 1010b which does not overlap with the gate electrode 1011. The size of the tapered shape region of the gate electrode 1011 can be freely regulated at this point within the extent of the gate electrode 1007 by suitably changing the dry etching process conditions. Namely, the size of the Lov region 1010a and the size of the Loff region 1010b can be freely regulated within the extent of the tapered shape region of the gate electrode 1007. Further, a base gate insulating film 1012 which is exposed form the gate electrode 1011 becomes additionally thinner due to dry etching. The resist pattern 1006 used as a dry etching mask for the gate electrode 1011 becomes unnecessary, and is removed next. Note that the removal of the resist pattern 1006 may also be performed before performing the high concentration ion injection process. (See FIG. 10C.)

Note that, although a method of forming a GOLD structure polycrystalline silicon TFT is discussed here, it is of course also possible to apply the photomasks or reticles 901, 905, and 910, used for forming the gate electrodes and in which the supplemental patterns having a function of lowering the intensity of light are set, to the formation of a GOLD structure MOS transistor using a semiconductor substrate such as a silicon substrate. In this case, the high concentration impurity region (n+region) which becomes a source region and a drain region, and the low concentration impurity region (n−region) which overlaps with the gate electrode are formed in the semiconductor substrate such as a silicon substrate.

Embodiment Mode 4

Various types of circuits are included in a semiconductor device such as a liquid crystal display, and although there are cases in which a GOLD structure having a superior effect against hot carriers is suitable, there are also cases in which an LDD structure having a small off current value is appropriate. Single drain structures may also be suitable, depending upon the circumstances. It is therefore necessary to form GOLD structure, LDD structure, and single drain structure polycrystalline silicon TFTs separately for each circuit. In embodiment mode 4, a method of forming GOLD structure, LDD structure, and single drain structure polycrystalline silicon TFTs separately for each circuit is discussed based upon FIGS. 11A to 11E.

Note that, an example of a case in which a tapered shape region, which is a film remaining after etching, remains in a gate electrode 1123 of an LDD structure formation region 1502 after a second dry etching process is shown in embodiment mode 4, and that a case in which formation of a resist pattern for opening only an LDD structure formation region 1502 and the third dry etching process are necessary in a following process step is discussed. Further, the structures of the photomasks or reticles 901, 905, and 910 used for forming the gate electrodes (see FIGS. 9A, 9B, and 9D) have already been discussed in embodiment mode 1, and therefore an explanation thereof will be omitted here.

Concerning the substrate structure used here, a substrate having a structure in which a polycrystalline silicon film 1102 having a predetermined film thickness, a gate insulating film 1103 having a predetermined film thickness and a gate electrode film 1104 having a predetermined film thickness are each laminated on a glass substrate 1101 are used. Photolithography process is applied to the photomasks or reticles 901, 905, and 910 (see FIGS. 9A, 9B, and 9D) used for forming the gate electrodes in which supplemental patterns having a function of reducing light intensity, and composed of a diffraction grating pattern or a translucent film are set, and post development resist patterns 1105, 1106, and 1107 are formed on the substrate having the above structure. The width of the supplemental pattern in the pattern 1105 and the width of the supplemental pattern in the pattern 1106 differ from each other here, but the widths may also be made the same, of course.

The supplemental patterns having a function of reducing the intensity of light are suitably set in mask patterns, used for forming gate electrodes corresponding to the GOLD structure formation region 1501 and the LDD structure formation region 1502, in the photomask or reticles 901, 905, and 910 used for forming the gate electrodes. A supplemental pattern is not set in the mask pattern used for forming a gate electrode corresponding to a single drain structure formation region 1503. As a result, tapered shape regions in which the resist film thickness gradually becomes thinner, with proximity to edge portions, are set in the post development resist patterns 1105 and 1106 corresponding to the GOLD structure formation region 1501 and the LDD structure formation region 1502, respectively. The tapered shape region does not exist in the post development resist pattern 1107 of the single drain structure formation region 1503, and the post development resist pattern 1107 is formed with a rectangular shape. (See FIG. 11A.)

Note that each resist film thickness of the tapered shape regions of the post development resist patterns 1105 and 1106 in the GOLD structure formation region 1501 and in the LDD structure formation region 1502 becomes thinner with proximity to edge portions of the tapered shape region, and it becomes possible to freely set resist patterns by regulating the transmittivity of the supplemental pattern region set in each of the corresponding mask patterns. The tapered shape regions of the resist post development resist patterns 1105 and 1106 are formed in an appropriate resist film thickness by considering the remaining film thickness of the tapered shape regions of the gate electrodes formed by subsequent process steps, a first dry etching process and a second dry etching process. Further, it is possible to freely set the size of the tapered shape regions of the post development resist patterns 1105 and 1106 in the GOLD structure formation region 1501 and in the LDD structure formation region 1502 by regulating the size of the supplemental pattern region set in each of the corresponding mask patterns. The tapered shape regions of the post development resist patterns 1105 and 1106 are formed with appropriate lengths in consideration of the size of each low concentration impurity region (n−region) in the final formed GOLD structure and LDD structure transistors.

In embodiment mode 4, the resist film thicknesses of the tapered shape regions of the post development resist patterns 1105 and 1106 in the GOLD structure formation region 1501 and the LDD structure formation region 1502 are equal, and a case in which the tapered shape region in the post development resist pattern 1106 of the LDD structure formation region 1502 is smaller in size than the post development resist pattern 1105 in the GOLD structure formation region 1501 is shown. (See FIG. 11A.)

A first dry etching process is performed next. Gate electrodes 1111 and 1112, having tapered shape regions in which the gate electrode film thickness becomes thinner with proximity to the edge portions of the gate electrode, are formed in the GOLD structure formation region 1501 and in the LDD structure formation region 1502 by the dry etching process performed for a predetermined amount of time. Dry etching is performed at this time such that each remaining film thickness of the tapered shape regions of the gate electrodes 1111 and 1112 becomes a predetermined film thickness on the order of 5 to 30% of the initial film thickness. On the other hand, a rectangular shape gate electrode 1113 is formed in the single drain structure formation region 1503. Note that the resist patterns which become dry etching masks change from the shapes of the post development resist patterns 1105, 1106, and 1107 to post dry etching resist patterns 1108, 1109, and 1110, respectively. Furthermore, the shapes of the gate electrodes of regions exposed form the gate electrodes 1111, 1112, and 1113 become thinner by etching, and change into shapes of gate insulating films 1114, 1115, and 1116, respectively. (See FIG. 11B.)

High concentration ion injection of an n-type impurity is performed next with the gate electrodes 1111, 1112, and 1113 as masks. High concentration impurity regions (n+regions) 1117 and 1119, which become a source region and a drain region, are formed in the polycrystalline silicon film 1102 corresponding to the outside of the gate electrodes 1111 and 1112 in the GOLD structure formation region 1501 and in the LDD structure formation region 1502. Low concentration impurity regions (n−regions) 1118 and 1120 are formed in the polycrystalline silicon film 1102 corresponding to the tapered shape region, and in which the film thickness of the gate electrode is thin. In the single drain structure formation region 1503, only a high concentration impurity regions (n+region) 1121, which becomes a source region and a drain region, are formed in the polycrystalline silicon film 1102 corresponding to the outside of the gate electrode 1113. Note that the removal of the resist patterns may also performed before performing the high concentration ion injection process. (See FIG. 11B.)

A second dry etching is performed next. The tapered shape region of the gate electrode 1111 in the GOLD structure formation region 1501 is dry etched by this dry etching process performed for a predetermined amount of time. The gate electrode film of the tapered shape region becomes additionally thinner, the edge portions of the gate electrode 1111, namely the edge portions of the tapered shape region, recede, and a gate electrode 1122 is formed. The low concentration impurity region (n−region) 1118 is segregated into an Lov region 1118a which overlaps with the gate electrode 1122, and an Loff region 1118b which does not overlap with the gate electrode 1122. The tapered shape region of the gate electrode 1112 in the LDD structure formation region 1502 is also etched similarly to that of the GOLD structure formation region 1501, and a gate electrode 1123 having a tapered shape region, namely the film remaining after etching, is formed. Dry etching is also performed similarly on the gate electrode 1113 of the single drain structure formation region 1503, and a gate electrode 1124 is formed, but the gate electrode 1113 is a rectangular shape, and therefore the gate insulating film 1116 of the base is additionally etched, and it only becomes thinner. The resist patterns used as dry etching masks for the gate electrodes 1122, 1123, and 1124 become unnecessary, and are next removed. (See FIG. 11C.)

The tapered shape region, namely the film remaining after etching, of the gate electrode 1123, remains in the LDD structure formation region 1502, and therefore is necessary to selectively remove the tapered shape region. New resist patterns 1125 to 1127 are therefore formed so that only the LDD structure formation region 1502 is open. (See FIG. 11D.)

A third dry etching process is performed next. The tapered shape region of the gate electrode 1123 in the LDD structure formation region 1502 is selectively etched and is removed by this dry etching process performed for a predetermined amount of time, and a rectangular shape gate electrode 1128 is formed. As a result, this becomes a structure in which the low concentration impurity region (n−region) formed in the polycrystalline silicon film and the gate electrode 1128 do not overlap, and an LDD structure transistor is formed. The resist patterns 1125 through 1127, used as dry etching masks, are then removed. (See FIG. 11E.)

Note that although a method of forming GOLD structure, LDD structure, and single drain structure polycrystalline silicon TFTs separately is discussed here, it is also possible, of course, to form similarly structure MOS transistor using a semiconductor substrate such as a silicon substrate with the photomasks or reticles 901, 905, and 910 used for forming the gate electrodes in which the supplemental patterns having a function for reducing the intensity of light are set. In this case, the high concentration impurity region (n+region) and the low concentration impurity region (n−region) are each formed in the semiconductor substrate, such as a silicon substrate.

GOLD structure, LDD structure, and single drain structure thin film transistors can be formed separately for each circuit in accordance with the above manufacturing process.

Embodiment Mode 5

Figure 12A:
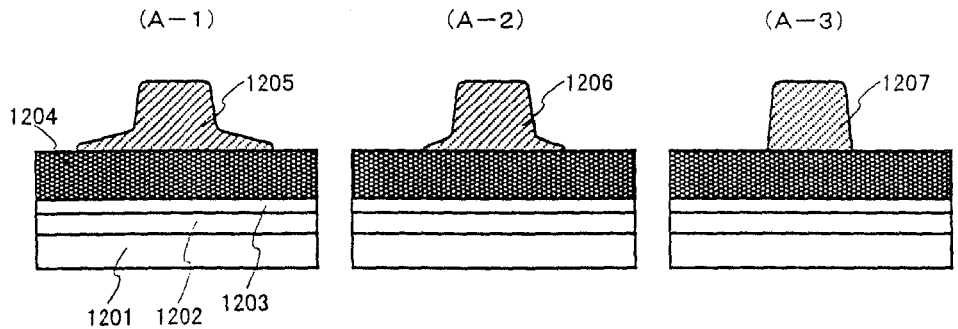
FIGS. 12A to 12C are a method of forming GOLD structure, LDD structure, and single drain structure polycrystalline silicon TFTs for different circuits by utilizing a photomask, or a reticle, used for forming a gate electrode in which a supplemental pattern having a function of reducing the intensity of light is set (simple process)
Figure 12B:
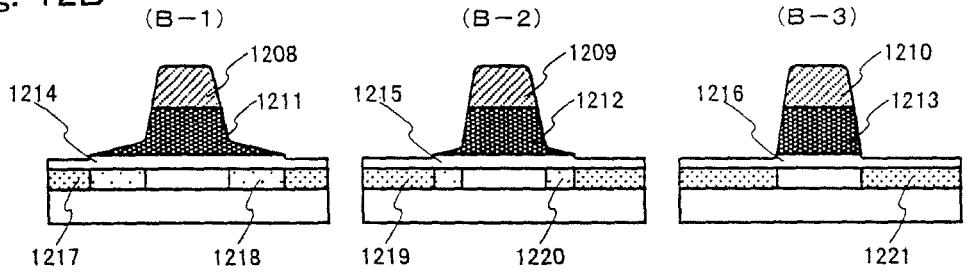
Figure 12C:
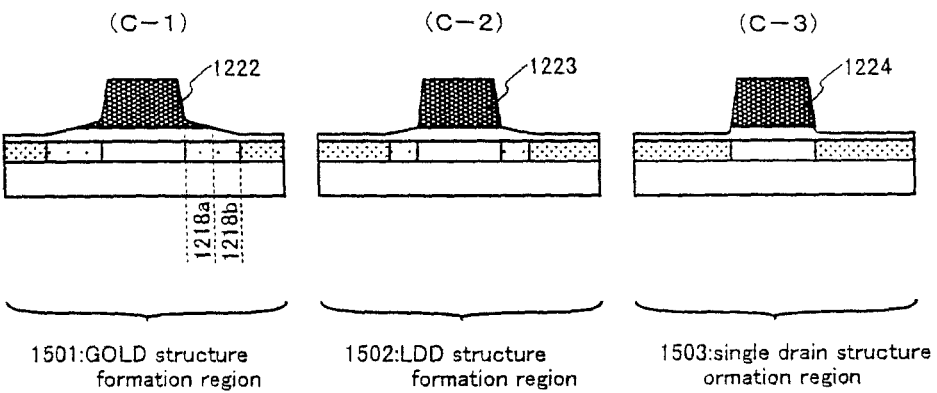
Figures 13A, 13B:
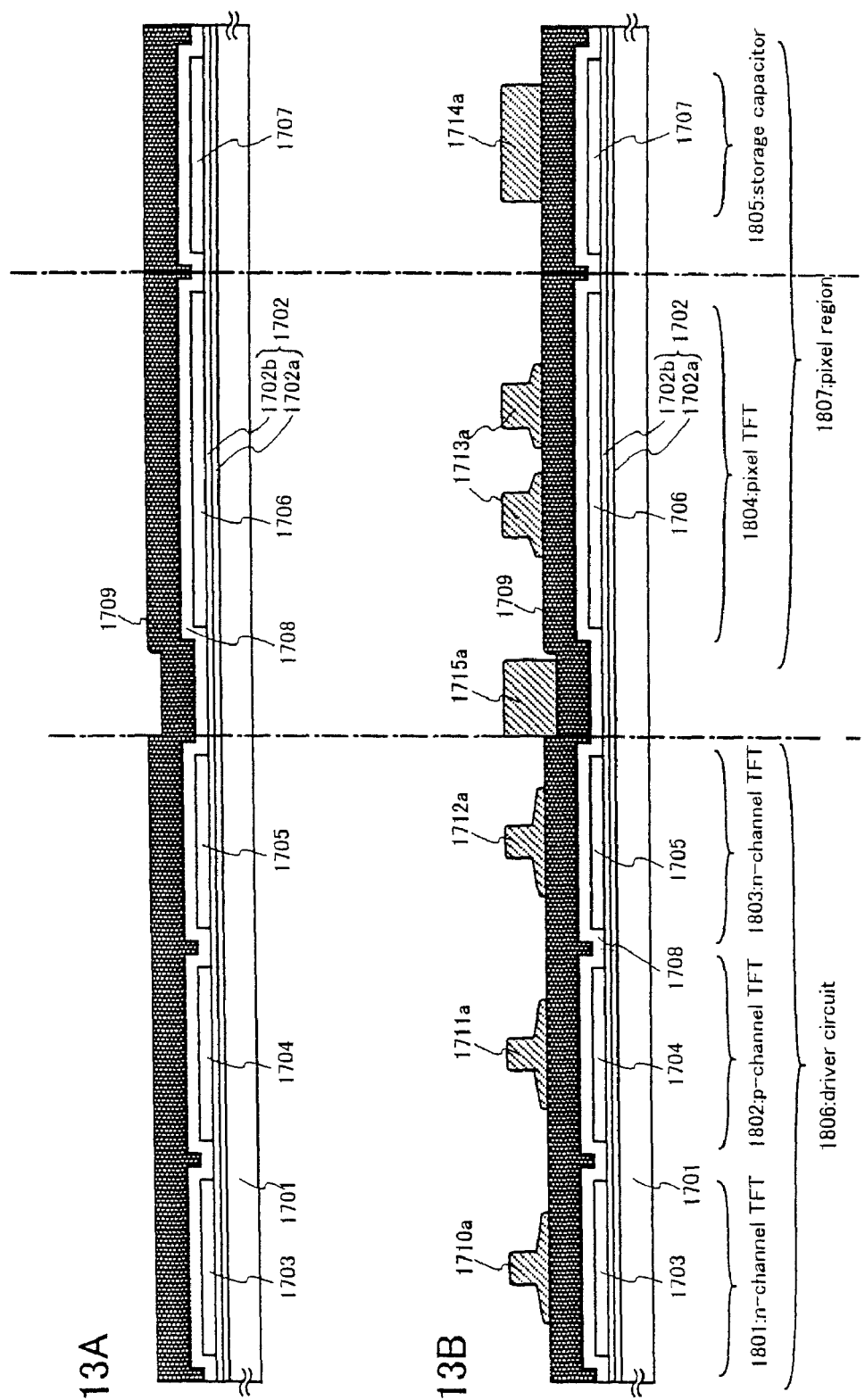
FIGS. 13A and 13B are a method of manufacturing a liquid crystal display by utilizing a photomask, or a reticle, used for forming a gate electrode in which a supplemental pattern having a function of reducing the intensity of light is set (1)
Figures 16A, 16B:
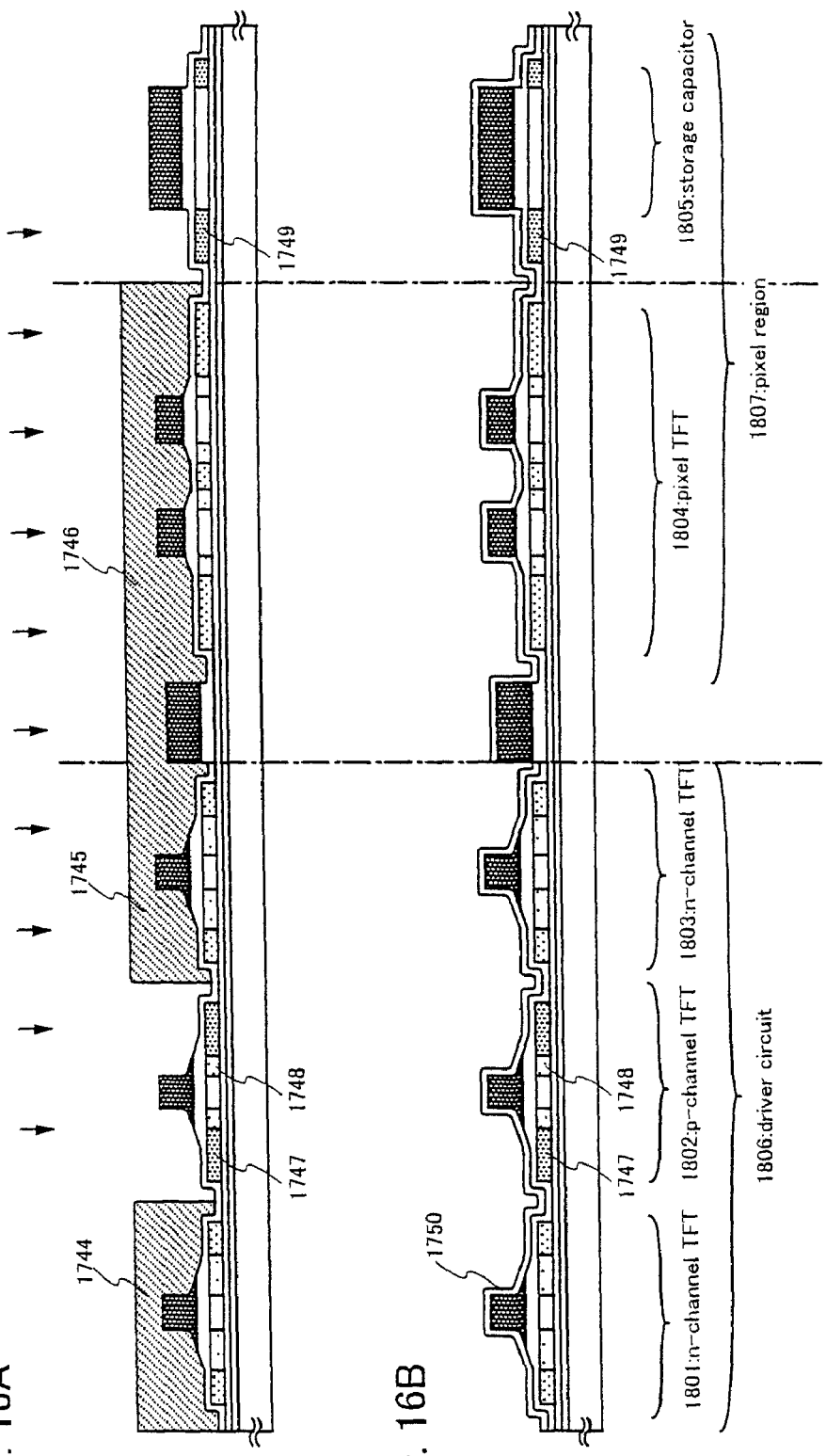
FIGS. 16A and 16B are the method of manufacturing a liquid crystal display by utilizing a photomask, or a reticle, used for forming a gate electrode in which a supplemental pattern having a function of reducing the intensity of light is set (4)
Figures 17A, 17B:
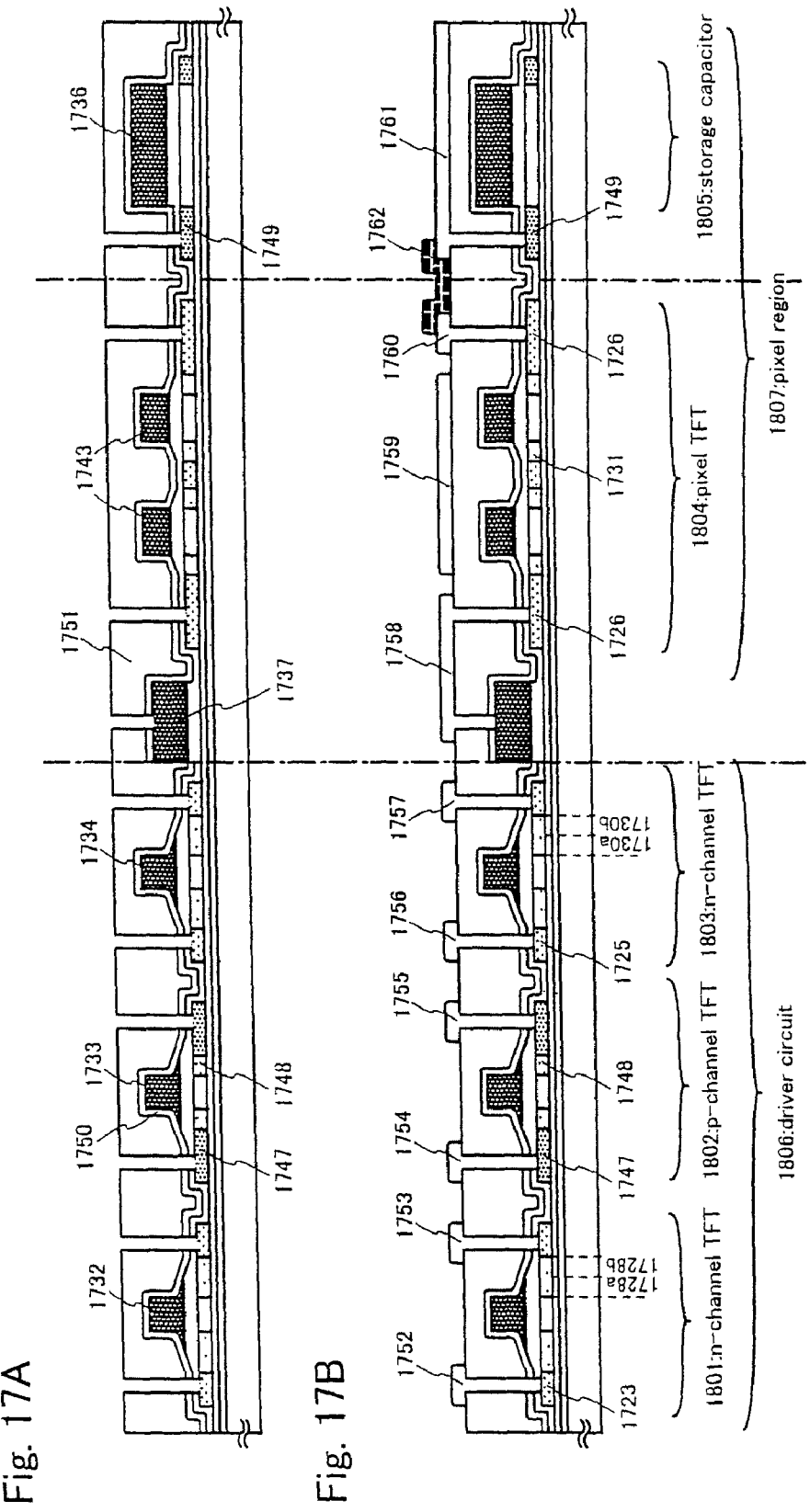
FIGS. 17A and 17B are the method of manufacturing a liquid crystal display by utilizing a photomask, or a reticle, used for forming a gate electrode in which a supplemental pattern having a function of reducing the intensity of light is set (5)

A simplified process in which the resist pattern formed for opening only the LDD structure formation region 1502, and the third dry etching process, become unnecessary in a method of forming GOLD structure, LDD structure, and single drain structure thin film transistors separately for different circuits is discussed in embodiment mode 5 based on FIGS. 12A to 12C.

Concerning the substrate structure used here, a substrate having a structure in which a polycrystalline silicon film 1202 having a predetermined film thickness, a gate insulating film 1203 having a predetermined film thickness, and a gate electrode film having a predetermined film thickness are each laminated on a glass substrate 1201. Photolithography processing is applied to the photomasks or reticles 901, 905, and 910 (see FIGS. 9A, 93, and 9D) used for forming gate electrodes and in which supplemental patterns having a function of reducing light intensity, and composed of a diffraction grating pattern or a translucent film are set, and post development resist patterns 1205, 1206, and 1207 are formed one the substrate having the above structure.

The supplemental patterns having a function of reducing the intensity of light are suitably set in mask patterns, used for forming gate electrodes corresponding to the GOLD structure formation region 1501 and the LDD structure formation region 1502, in the photomask or reticles 901, 905, and 910 used for forming the gate electrodes. The above supplemental pattern is not set in the mask pattern used for forming a gate electrode corresponding to a single drain structure formation region 1503. As a result, tapered shape regions in which the resist film thickness gradually becomes thinner, with proximity to edge portions, are set in the post development resist patterns 1205 and 1206 corresponding to the GOLD structure formation region and the LDD structure formation region 1502, respectively. A tapered shape region does not exist in the post development resist pattern 1207 of the single drain structure formation region 1503, and the post development resist pattern 1207 with a rectangular shape is formed. (See FIG. 12A.)

In embodiment mode 5, in order that the tapered shape region, namely the film remaining after etching, in the gate electrode of the LDD structure formation region 1502 does not remain in a second dry etching process, and therefore the resist film thickness of the tapered shape region of the post development resist pattern 1206 in the LDD structure formation region 1502 is structured so as to be relatively thin in comparison to the post development resist pattern 1205 in the GOLD structure formation region 1501. (See FIG. 12A.)

A first dry etching process is performed next. Gate electrodes 1211 and 1212, having tapered shape regions in which the gate electrode film thickness becomes thinner with proximity to the edge portions of the gate electrode, are formed in the GOLD structure formation region 1501 and in the LDD structure formation region 1502 by the dry etching process performed for a predetermined amount of time. Dry etching is performed at this time such that the remaining film thickness of the tapered shape regions of the gate electrodes 1211 and 1212 in the GOLD structure formation region 1501 and in the LDD structure formation region 1502 becomes a predetermined film thickness on the order of 5 to 30% of the initial film thickness. The remaining film thickness of the tapered shape region in the gate electrode 1212 is relatively thin compared to that in the gate electrode 1211. On the other hand, a rectangular shape gate electrode 1213 is formed in the single drain structure formation region 1503. Note that the resist patterns which become dry etching masks change from the shapes of the post development resist patterns 1205, 1206, and 1207 to the post dry etching resist patterns 1208, 1209, and 1210, respectively. Furthermore, the shapes of the gate insulating film of regions exposed form the gate electrodes 1211, 1212, and 1213 become thinner by etching, and change shape to gate insulating films 1214, 1215, and 1216. (See FIG. 12B.)

High concentration ion injection of an n-type impurity is performed next with the gate electrodes 1211, 1212, and 1213 as masks. High concentration impurity regions (n+regions) 1217 and 1219, which become a source region and a drain region, are formed in the polycrystalline silicon film 1202 corresponding to the outside of the gate electrodes 1211 and 1212 in the GOLD structure formation region 1501 and in the LDD structure formation region 1502. Low concentration impurity regions (n−regions) 1218 and 1220 are formed in the polycrystalline silicon film 1202 corresponding to the tapered shape region, and in which the film thickness of the gate electrode is thin. In the single drain structure formation region 1503, only a high concentration impurity regions (n+region) 1221, which becomes a source region and a drain region, are formed in the polycrystalline silicon film 1202 corresponding to the outside of the gate electrode 1213. (See FIG. 12B.)

A second dry etching is performed next. The tapered shape region in the edge portions of the gate electrode 1211 in the GOLD structure formation region 1501 is dry etched by this dry etching process performed for a predetermined amount of time. The gate electrode film thickness of the tapered shape region becomes additionally thinner, the edge portions of the gate electrode 1211, namely the edge portions of the tapered shape region, recede, and a gate electrode 1222 is formed. The low concentration impurity region (n−region) 1218 is segregated into an Lov region 1218a which overlaps with the gate electrode 1222, and an Loff region 1218b which does not overlap with the gate electrode 1222. Further, the remaining film thickness of the tapered shape region of the gate electrode 1212 after the first dry etching process is relatively thin for the case of the LDD structure formation region 1502, and therefore the tapered shape region is completely removed by the second dry etching process, forming a rectangular shape gate electrode 1223. The gate electrode 1223 becomes a structure in which it does not overlap with the low concentration impurity region (n−region) 1220, and an LDD structure transistor is formed. Dry etching is also performed similarly on the gate electrode 1213 of the single drain structure formation region 1503, and a gate electrode 1224 is formed, but the gate electrode 1213 is a rectangular shape, and therefore the gate insulating film 1216 of the base is additionally etched, and it only becomes thinner. The resist patterns used as dry etching masks for the gate electrodes 1222, 1223, and 1224 become unnecessary, and are next removed. Note that the removal of the resist patterns may also be performed before performing the high concentration ion injection. (See FIG. 12C.)

GOLD structure, LDD structure, and single drain structure thin film transistors can be formed separately for each circuit in accordance with the above simplified manufacturing process.

An additionally detailed explanation of the present invention, explained by the embodiment modes 1 to 5 above, is made in embodiments below.

Embodiment 1

A method of manufacturing an active matrix liquid crystal display structured by GOLD structure and LDD structure polycrystalline silicon TFTs, and in which a photolithography process used for forming gate electrodes is applied to the photomasks or reticles 101, 105, and 110 (see FIGS. 1A, 1B, and 1D) set into supplemental patterns having a function of reducing the intensity of light and composed of a diffraction grating pattern or a translucent film, is explained in detail using FIGS. 4 to 8B. Note that, although a method of forming GOLD structure, LDD structure, and single drain structure polycrystalline silicon TFTs separately is discussed, a method of manufacturing a liquid crystal display structured by GOLD structure and LDD structure polycrystalline silicon TFTs discussed in embodiment 1.

Figure 4:
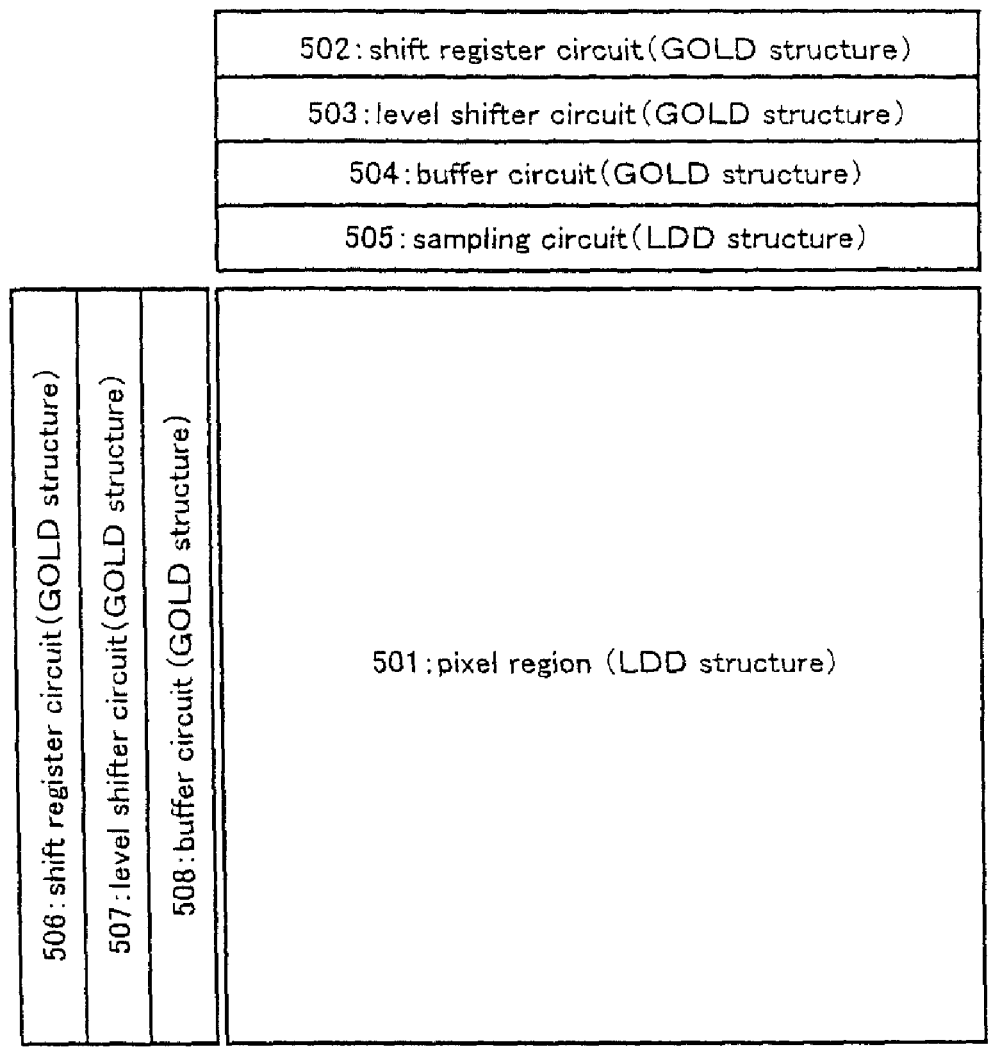
FIG. 4 is a circuit structure of an entire liquid crystal display.

First, a circuit structure of an entire liquid crystal display is shown in FIG. 4. The liquid crystal display is structured by a pixel region 501 and by peripheral circuits for driving the pixel region 501. The peripheral circuits are structured by shift register circuits 502 and 506, by level shifter circuits 503 and 507, by buffer circuits 504 and 508, and by a sampling circuit 505. GOLD structure polycrystalline silicon TFTs which are superior against hot carriers, are used in the shift register circuits 502 and 506, in the level shifter circuits 503 and 507, and in the buffer circuits 504 and 508 of the peripheral circuits. On the other hand, LDD structure polycrystalline silicon TFTs which have a superior effect of suppressing the value of the off current are used in the pixel region 501 and in the sampling circuit 505, which is a portion of the peripheral circuits. (See FIG. 4.)

The method of manufacturing the liquid crystal display with the above circuit structure is discussed in detail using FIGS. 5A to 8B.

First, a first layer silicon oxynitride film 602a with a film thickness of 50 nm and a 100 nm thick second layer silicon oxynitride film 602b, each having differing composition ratios, are laminated on a glass substrate 601 by plasma CVD, forming a base film 602. Note that a material such as a quartz glass, barium borosilicate glass, or aluminum borosilicate glass substrate is used as the glass substrate 601 here. Next, after laminating a 55 nm thick amorphous silicon film on the base film 602 (602a and 602b) by plasma CVD, a nickel containing solution is maintained on the amorphous silicon film. After performing dehydrogenation of the amorphous silicon film (at 500° C. for 1 hour), thermal crystallization is performed (at 550° C. for 4 hours), and a polycrystalline silicon film is formed by additional laser annealing processing. The polycrystalline silicon film is patterned next by photolithography and etching processes, forming semiconductor layers 603 to 607. Doping of an impurity element (boron or phosphorous) for controlling Vth of TFTs may also be performed after forming the semiconductor layers 603 to 607. A gate insulating film 603 made from a 110 nm thick silicon oxynitride film is then formed so as to cover the semiconductor layers 603 to 607 by plasma CVD, and a gate electrode film 609 made from a 400 nm thick TaN film is laminated on the gate insulating film 608 by sputtering. (See FIG. 5A.)

Next, a photolithography process is applied to the photomasks or reticles 101, 105, and 110 (see FIGS. 1A, 1B, and 1D) which are set into supplemental patterns and which are structured by diffraction grating patterns composed of lines and spaces, or by translucent films, and having a function of reducing the transmittivity of exposure light. Post development resist patterns 610a to 615a used for forming gate electrodes and having a shape in which both sides of their edge portions become thinner are formed (see FIG. 5B.)

A process of dry etching is performed on the 400 nm thick gate electrode film 609 made from the TaN film, with the post development resist patterns 610a to 615a used for forming the gate electrodes as masks. Etching is performed so that the shape of the gate electrodes after dry etching is a convex shape in which edge portions of both sides become thinner, and so that the film thickness of the thin regions becomes on the order of 5 to 30% of the initial film thickness of 400 nm (preferably between 7 and 8%, on the order of 30 nm). The shape of the resist patterns in the dry etching process at this point changes from the post development resist patterns 610a to 615a, in which the resist film thickness of edge portions on both sides is formed to be thin, to post dry etching resist patterns 610b to 615b in which the thin resist film thickness regions vanish. Further, regions of the gate insulating film 608 made from the silicon oxynitride film exposed from gate electrodes 617 to 622 change into a gate insulating film 616 having a thinner shape due to dry etching.

Next, ion injection of a low concentration of an n-type impurity is performed in a first ion injection process without removing the post dry etching resist patterns 610b to 615b, forming low concentration impurity regions (n−regions) 623 to 627 in the semiconductor layers 603 to 607 corresponding to regions exposed from the gate electrodes 617 to 622. The ion injection conditions at this point are that phosphorous (P) is used as the n-type impurity, the dose amount is set from $3\times10^{12}$ to $3\times10^{13}$ atoms/cm$^2$, and the acceleration voltage is set from 60 to 100 KV. (See FIG. 6A.)

The post dry etching resist patterns 610b to 615b are removed next. Note that the removal of the resist patterns 610b to 615b may also be performed before performing the low concentration ion injection. After that, in order to give a pixel TFT 704 an LDD structure, a resist pattern 628, which becomes a mask during a second ion injection process, is formed next so as to cover the gate electrode 620 existing in corresponding regions.

Ion injection of a high concentration of an n-type impurity is then performed in the second ion injection process. The ion injection conditions are a dose amount of $5\times10^{14}$ to $5\times10^{15}$ atoms/cm$^2$ and an acceleration voltage set from 60 to 100 KV.

In a region of the pixel TFT 704, which is a pixel region 707 of an LDD structure formation region, a high concentration impurity regions (n+region) 632 which becomes a source region and a drain region is formed in the semiconductor layer 606 corresponding to a region exposed from the resist pattern 628 in accordance with ion injection with the resist pattern 628 covering the gate electrode 620 as a mask. In the semiconductor layer 606 corresponding to a region on the outside of the gate electrode 620 and on the inside of the resist pattern 628, the low concentration impurity region (n−region) 626 is already formed by the first ion injection process, and an LDD structure polycrystalline silicon TFT is formed by combing the low concentration impurity region (n−region) 626 with the high concentration impurity region (n+region) 632 formed in accordance with the second ion injection process.

On the other hand, in a driver circuit 706 of the peripheral circuits, which is a GOLD structure formation region, high impurity concentration regions (n+regions) 629 to 631 which become source regions and drain regions in the semiconductor layers 603 to 605 corresponding to regions exposed from the gate electrodes 617 to 619, are formed in accordance with performing ion injection with the gate electrodes 617 to 619 as masks. At the same time, low concentration impurity regions (n−regions) 634 to 636 are formed in the semiconductor layers 603 to 605 corresponding to regions in which the gate electrode film becomes thinner on both sides of the gate electrodes 617 to 619. Considering the different film thicknesses of both side of the gate electrodes 617 to 619, the high concentration impurity regions (n+regions) 629 to 631 and the low concentration impurity regions (n−regions) 634 to 636 can be formed at the same time by suitable selecting the acceleration voltage and the ion injection amount during ion injection, and GOLD structure polycrystalline silicon TFTs can be formed.

Note that the second ion injection is also performed in a storage capacitor 705 of the pixel region 707 with the gate electrode 621 (actually a simple electrode, not a gate electrode, because this is a capacitor formation region) as a mask, and therefore a high concentration impurity region (n+region) 633 and a low concentration impurity region (n−region) 637 are formed at the same time in the semiconductor layer 607 by utilizing the difference in the film thickness of the gate electrode 621. A structure which is structurally analogous to a GOLD structure is formed, but this is not a GOLD structure because it is not a polycrystalline silicon TFT formation region. (See FIG. 6B.)

By performing a new photolithography process, openings are performed in the both resist in a p-channel TFT 702 region in the driver circuit 706, and in the storage capacitor 705 region in the pixel region 707, and patterning are performed so that the other regions covered by the resist patterns 638 to 640.

Ion injection of a high concentration of a p-type impurity element is performed in a third ion injection process with the resist patterns 638 to 640 as masks. A p-type impurity such as boron (B), an impurity element which imparts a conductivity type which is opposite to the above single conductivity type, is injected into the p-channel TFT 702 region with the gate electrode 618 as a mask, and a high concentration impurity region (p+region) 641 which becomes a source region and a drain region are formed in the semiconductor layer 604 corresponding to the region exposed from the gate electrode 618. A low concentration impurity region (p−region) 643 is formed in the semiconductor layer 604 corresponding to regions in which the film thickness is thin on both sides of the gate electrode 618, and a GOLD structure polycrystalline TFT is formed. The third ion injection regions have already been ion injected with the n-type impurity element phosphorous (P) in the first and the second ion injection processes, but the third ion injection process is performed so that concentration of the p-type impurity boron (B) is set from $2\times10^{20}$ to $2\times10^{21}$ atoms/cm$^3$, and therefore these regions can function as source and drain regions of a p-channel polycrystalline silicon TFT.

Note that, similar to the p-channel TFT 702, a high concentration impurity region (n+region) 642 and a low concentration impurity region (n−region) 644 are also formed in the corresponding the semiconductor layer 607 in the storage capacitor 705 region. The structure of the storage capacitor 705 region which is structurally analogous to a GOLD structure is formed, but this is not a GOLD structure because it is not a polycrystalline silicon TFT formation region. (See FIG. 7A.)

After next removing the resist patterns 638 to 640, a first interlayer insulating film 645 made from a 150 nm thick silicon oxynitride film is laminated by plasma CVD. In addition, thermal annealing processing is performed at 550° C. for 4 hours in order to thermally activate each of the impurity elements which have been ion injected into the semiconductor layers 603 to 607. Note that, in embodiment 1, in order to reduce the value of the off current and to increase the electric field effect mobility of the TFTs, at the same time as the process of activating the impurity elements is performed, the nickel (Ni) which is used as a catalyst during crystallization of the semiconductor layers 603 to 607 is gettered by the impurity regions 629 to 633 containing a high concentration of phosphorous (P). A reduction in the nickel (Ni) concentration within the semiconductor layers which become channel forming regions is thus realized. Polycrystalline silicon TFTs having channel forming regions manufactured by this type of method have good crystallinity and a high electric field effect mobility, and therefore they show good electric characteristics such as a reduced value of the off current. The activation process may also be performed before laminating the first interlayer insulating film 645, but for cases in which the wiring material of the gate electrodes 617 to 622 has weak heat resistance, it is preferable to perform the activation process after laminating the interlayer insulating film, as in embodiment 1. By next performing heat treatment for one hour at 410° C. in a nitrogenous atmosphere containing 3% hydrogen, a process of hydrogenation in order to terminate dangling bonds in the semiconductor layers 603 to 607 is performed. (See FIG. 7B.)

A second interlayer insulating film 646 composed of an organic insulating material made from a 1.6 μm thick acrylic resin film is formed on the first interlayer insulating film 645 made from a silicon oxynitride film. Contact holes in order to connect to the gate electrode 622 which functions as a source wiring, and in order to connect to the first ion injection and third injection regions, the impurity regions 629, 631, 632, 641, and 642, are formed next by a photolithography process and a dry etching process. (See FIG. 8A.)

Metallic wirings 647 to 652 are formed next in order to electrically connect to each of the impurity regions 629, 631, and 641 in the driver circuit 706. Further, connection electrodes 653, 655, and 656, and a gate wiring 654 are formed in the pixel portion 707 at the same time as the metallic wirings 647 to 652 are formed. Note that a lamination film of a 50 nm thick Ti film and a 500 nm thick Al—Ti alloy film is applied as the metallic wiring material. The connection electrode 653 and is for electrically connecting the gate electrode 622 functions as a source wiring with the pixel TFT 704, through the impurity region 632. The connection electrode 655 is electrically connected to the impurity region 632 of the pixel TFT 704, and the connection electrode 656 is electrically connected to the impurity region 642 of the storage capacitor 705. The gate wiring 654 is for electrically connecting the plurality of gate electrodes 620 of the pixel TFT 704. A pixel electrode 657 is formed next by laminating an 80 to 120 nm thick transparent conducting film such as ITO (indium tin oxide) using a photolithography process and an etching process. The pixel electrode 657 is electrically connected to the impurity region 632, which is the drain region of the pixel TFT 704, through the connection electrode 655, and in addition, is electrically connected to the impurity region 642, which functions as one electrode forming the storage capacitor 705, through the connection electrode 656. (See FIG. 8B.)

A liquid crystal display structured by the driver circuit 706 having an n-channel TFT 701, a p-channel TFT 702, an n-channel TFT 703, and by the pixel region 707 having the pixel TFT 704 and the storage capacitor 705, can thus be manufactured.

Embodiment 2

A method of manufacturing an active matrix liquid crystal display structured by GOLD structure and LDD structure polycrystalline silicon TFTs, and in which a photolithography process used for forming gate electrodes is applied to the photomasks or reticles 901, 905, and 910 (see FIGS. 9A, 9B, and 9D) set into supplemental patterns having a function of reducing the intensity of light and composed of a diffraction grating pattern or a translucent film, is explained in detail using FIGS. 13A to 17B.

Note that an example of a case in which a tapered shape region, which is a film remaining after etching, remains in a gate electrode 1735 of an LDD structure formation region (see FIG. 14B) after a second dry etching process is shown in embodiment 2, and that a resist pattern formation in order to for an opening only in the LDD structure formation region, and a third dry etching process, are necessary in the next process steps, are discussed.

First, a first layer silicon oxynitride film 1702a with a film thickness of 50 nm and a 100 nm thick second layer silicon oxynitride film 1702b, each having differing composition ratios, are laminated on a glass substrate 1701 by plasma CVD, forming a base film 1702. Note that a material such as a quartz glass, barium borosilicate glass, or aluminum borosilicate glass substrate is used as the glass substrate 1701 here. Next, after laminating a 55 nm thick amorphous silicon film on the base film 1702 (1702a and 1702b) by plasma CVD, a nickel containing solution is maintained on the amorphous silicon film. After performing dehydrogenation of the amorphous silicon film (at 500° C. for 1 hour), thermal crystallization is performed (at 550° C. for 4 hours), and a polycrystalline silicon film is formed by additional laser annealing processing. The polycrystalline silicon film is patterned next by photolithography and etching processes, forming semiconductor layers 1703 to 1707. Doping of an impurity element (boron or phosphorous) for controlling Vth of TFTs may also be performed after forming the semiconductor layers 1703 to 1707. A gate insulating film 1708 made from a 110 nm thick silicon oxynitride film is then formed so as to cover the semiconductor layers 1703 to 1707 by plasma CVD, and a gate electrode film 1709 made from a 400 nm thick TaN film is laminated on the gate insulating film 1708 by sputtering. (See FIG. 13A.)

Next, a photolithography process for forming a gate electrode is applied to the photomasks or reticles which set supplemental patterns structured by diffraction grating patterns composed of lines and spaces, or by translucent films, and having a function of reducing the transmittivity of exposure light. Post development resist patterns 1710a to 1713a having a shape in which both sides of their edge portions become thinner are formed using the photolithography process, and post development resist patterns 1714a and 1715a are formed using the photomasks or reticles which do not set supplemental patterns. (see FIG. 13B.)

A driver circuit 1806 region corresponds to a GOLD structure formation region, and a pixel TFT 1804 region of a pixel region 1807 corresponds to an LDD structure formation region, and therefore supplemental patterns having a function of reducing the intensity of light are established in corresponding mask patterns in photomasks or reticles used for forming suitable gate electrodes. Further, it is not necessary to set a supplemental pattern in a mask pattern corresponding to an electrode pattern which functions as a simple electrode in a pixel region 1807 region, and this therefore becomes a pattern structure in which a supplemental pattern is not established. As a result, tapered shape regions in which the resist film thickness gradually becomes thinner with closeness to the edge portions are formed in the post development resist patterns 1710a to 1712a of the GOLD structure formation region, and in the post development resist pattern 1713a of the LDD structure formation region. Note that the size of the tapered shape regions in the post development resist patterns 1710a to 1712a of the GOLD structure formation region, and the post development resist pattern 1713a of the LDD structure formation region, are formed with suitable lengths by regulating the size of the supplemental pattern regions of the corresponding mask patterns in consideration of the size of low concentration impurity regions (n−regions) in the final formed GOLD structure and LDD structure transistors. An example of a case in which the size of the tapered shape region in post development resist pattern 1713a of the LDD structure formation region is smaller in comparison to those of the post development resist patterns 1710a to 1712a in the GOLD structure formation region is shown in embodiment 2. On the other hand, the post development resist patterns 1714a and 1715a are resist patterns for forming simple electrodes, and therefore tapered shape regions do not exist. Rectangular shape resist patterns are formed. (See FIG. 13B.)

A first dry etching process is performed next with the post development resist patterns 1710a to 1715a as masks. As a result of etching for a predetermined amount of time in the dry etching process and using the post development resist patterns 1710a to 1712a of the GOLD structure formation region, and the post development resist pattern 1713a of the LDD structure formation region are used as etching masks, gate electrodes 1717 to 1720 having tapered shape regions with a structure, in which the gate electrode film thickness becomes thinner with proximity to the edge portions of the gate electrode, are formed. Etching is performed at this point so that the remaining film thickness of the tapered shape regions of the gate electrodes 1717 to 1720 becomes on the order of 5 to 30% of the initial film thickness of 400 nm (preferably between 7 and 8%, on the order of 30 nm). On the other hand, as a result of dry etching with the rectangular shape post development resist patterns 1714a and 1715a used as masks, rectangular shape electrodes 1721 and 1722 are formed. Note that, due to the dry etching process, the shapes of the post development resist patterns 1710a to 1715a change to post etching resist patterns 1710b to 1715b. Further, the gate insulating film 1708, made from a silicon oxynitride film, changes into a thinner shape gate insulating film 1716 due to dry etching in regions exposed from the gate electrodes 1717 to 1720, and the electrodes 1721 and 1722. (See FIG. 14A.)

Ion injection of a high concentration of an n-type impurity is performed next in a first ion injection process with the gate electrodes 1717 to 1720, and the electrodes 1721 and 1722, as masks. High concentration impurity regions (n+regions) 1723 to 1725, which become source regions and drain regions, are formed in regions corresponding to the outside of the gate electrodes 1717 to 1719 of the GOLD structure formation regions in the semiconductor layers 1703 to 1705. In addition, low concentration impurity regions (n−regions) 1728 to 1730 are formed in regions corresponding to the tapered shape regions in which the gate electrode film thickness is thin. Further, in the semiconductor layer 1706, a high concentration impurity region (n+region) 1726 which becomes a source region and a drain region is formed in a region corresponding to the outside of the gate electrode 1720 of the LDD structure formation region, and a low concentration impurity region (n−region) 1731 is formed in a region corresponding to the tapered shape region in which the gate electrode film thickness is thin. On the other hand, only a high concentration impurity region (n+region) 1727 is formed in a region corresponding to the outside of the electrode 1721 in the semiconductor layer 1707 which is a storage capacitor 1805 region. Phosphorous (P) is used as an n-type impurity at this point, with ion injection conditions of a dose amount set to $5 \times 10^{14}$ to $5 \times 10^{15}$ atoms/cm$^2$ and an acceleration voltage set between 60 and 100 KV. Further, the actual impurity concentration injected is on the order of $1 \times 10^{20}$ to $1 \times 10^{22}$ atoms/cm$^3$ in the high concentration impurity regions (n+regions) 1723 to 1726, and on the order of $1 \times 10^{18}$ to $1 \times 10^{19}$ atoms/cm$^3$ in the low concentration impurity regions (n−regions) 1728 to 1731. Note that the removal of the resist pattern may also be performed before performing the high concentration ion injection process. (See FIG. 14A.)

A second dry etching process is performed next. The tapered shape portions of the edge portions of the gate electrodes 1717 to 1719 in the GOLD structure formation regions are etched by this dry etching process performed for a predetermined amount of time. The film thickness of the tapered shape regions after etching becomes additionally thinner, and the edge portions of the tapered shape regions recede, forming gate electrodes 1732 to 1734. The low concentration impurity regions (n−regions) 1728 to 1730 are segregated into Lov regions 1728a to 1730a which overlap with the gate electrodes 1732 to 1734, and Loff regions 1728b to 1730b which do not overlap with the gate electrodes 1732 to 1734. The tapered shape regions of the gate electrode 1720 in the LDD structure formation region is also dry etched, similar to the dry etching of the GOLD structure formation regions, and a gate electrode 1735, having a tapered shape region which is a film remaining after etching, is fowled. On the other hand, although dry etching processing is also similarly performed for the rectangular shape electrodes 1721 and 1722, and electrodes 1736 and 1747 are formed, a large change in the shape of the electrodes is not seen. The resist patterns which were used as dry etching masks for the gate electrodes 1732 to 1735, and for the electrodes 1736 and 1737, become unnecessary and are removed next. (See FIG. 14B.)

The tapered shape region of the gate electrode 1735, which is a film remaining after etching, exists in the LDD structure formation region, and therefore it is necessary to selectively remove the tapered shape region. New resist patterns 1739 to 1742 are therefore formed such that only the LDD structure formation region has an opening. (See FIG. 15A.)

A third dry etching process is performed next. The tapered shape region of the gate electrode 1735 in the LDD structure formation region is selectively etched and removed by this dry etching process performed for a predetermined amount of time, and a rectangular shape gate electrode 1743 is formed. As a result, this becomes a structure in which the low concentration impurity region (n−region) 1731 formed in the semiconductor layer 1706 do not overlap with the gate electrode 1743, forming an LDD structure transistor. The resist patterns 1739 to 1742 used as dry etching masks are then removed. (See FIG. 15B.)

A new photolithography process for forming resist opening regions of a p-channel TFT region 1802 in a driver circuit 1806, and of a storage capacitor 1805 in a pixel region 1807 is performed, and resist patterns 1744 to 1746 are formed. (See FIG. 16A.)

Ion injection of a high concentration of a p-type impurity element is performed in a second ion injection process with the resist patterns 1744 to 1746 as masks. A p-type impurity such as boron (B), an impurity element which imparts a conductivity type opposite to the above single conductivity type, is injected into the p-channel TFT 802 region with the gate electrode 1733 as a mask. in the semiconductor layer 1704, a high concentration impurity regions (p+region) 1747 which become a source region and a drain region are formed in the region corresponding to the outside of the gate electrode 1733, and a low concentration impurity region (p−region) 1748 is formed in a region corresponding to the tapered shape region in which the gate electrode film thickness of the edge portions of the gate electrode 1733 become thin. The second ion injection regions have already been ion injected with the n-type impurity element phosphorous (P) in the first ion injection process, but the second ion injection process is performed so that concentration of the p-type impurity boron (B) is set to from $2\times10^{20}$ to $2\times10^{21}$ atoms/cm$^3$, and therefore these regions can function as source and drain regions of a p-channel TFT 1802. Note that, in the semiconductor layer 1707 which is the storage capacitor 805 formation region as well, a high concentration impurity region (p+region) 1749 is formed in a region corresponding to the outside of the electrode 1736. The structure of the semiconductor layer 1707 which is structurally similar to a single drain structure p-channel polycrystalline silicon TFT is formed, but the region functions as the storage capacitor 1805, and therefore, the semiconductor layer 1707 is not a single drain structure polycrystalline silicon TFT. (See FIG. 16A.)

After removing the resist patterns 1744 to 1746, a first interlayer insulating film 1750 made from a 150 nm thick silicon oxynitride film is laminated by plasma CVD. In addition, thermal annealing processing is performed at 550° C. for 4 hours in order to thermally activate each of the impurity elements (n type element and p type element) which have been ion injected into the semiconductor layers 1703 to 1707. Note that, in embodiment 2, with a goal of reducing the value of the off current and increasing the electric field effect mobility of the TFTs, the nickel (Ni) which is used as a catalyst during crystallization of the semiconductor layers 1703 to 1707 is gettered by the impurity regions 1723 to 1727 containing a high concentration of phosphorous (P) at the same time as the process of thermally activating the impurity elements is performed. A reduction in the nickel (Ni) concentration within the semiconductor layers which become channel forming regions is thus realized. Polycrystalline silicon TFTs having channel forming regions manufactured by this type of method have good crystallinity and a high electric field effect mobility, and therefore they show good electric characteristics such as a reduced value of the off current. The activation process may also be performed before laminating the first interlayer insulating film 1750, but for cases in which the wiring material of the gate electrodes 1732 to 1734 and 1743, and the electrodes 1736 and 1737, has weak heat resistance, it is preferable to perform the activation process after laminating the interlayer insulating film, as in embodiment 2. By next performing heat treatment for one hour at 410° C. in a nitrogenous atmosphere containing 3% hydrogen, a process of hydrogenation in order to terminate dangling bonds in the semiconductor layers 1703 to 1707 is performed. (See FIG. 16B.)

A second interlayer insulating film 1751 composed of an organic insulating material made from a 1.6 µm thick acrylic resin is formed on the first interlayer insulating film 1750 made from a silicon oxynitride film. Contact holes are then formed in the second interlayer insulating film 1751 by a photolithography process and a dry etching process. The contact holes are formed at this point in order to connect to the gate electrode 1737 which functions as a source wiring, and in order to connect to the impurity a regions 1723, 1725, 1726, 1747, and 1749. (See FIG. 17A.)

Metallic wirings 1752 to 1757 are formed next in order to electrically connect to each of the impurity regions 1723, 1725, and 1747 in the driver circuit 806. Further, connection electrodes 1758, 1760, and 1761, and a gate wiring 1759, of the pixel region 1807 are formed at the same time as the metallic wirings 1752 to 1757 are formed. Note that a lamination film of a 50 nm thick Ti film and a 500 nm thick Al—Ti alloy film is applied as the metallic wiring material. The connection electrode 1758 is for electrically connecting the gate electrode 1737, which functions as a source wiring, with the pixel TFT 1804, through the impurity region 1726. The connection electrode 1760 is electrically connected to the impurity region 1726 of the pixel TFT 1804, and the connection electrode 1761 is electrically connected to the impurity region 1749 of the storage capacitor 1805. The gate wiring 1759 is formed for electrically connecting the plurality of gate electrodes 1743 of the pixel TFT 1804. A pixel electrode 1762 is formed next by laminating an 80 to 120 nm thick transparent conductive film such as ITO (indium tin oxide) using a photolithography process and an etching process. The pixel electrode 1762 is electrically connected to the impurity region 1726, which is the source drain region of the pixel TFT 804, through the connection electrode 1760, and in addition, is electrically connected to the impurity region 1749, which functions as one electrode forming the storage capacitor 1805, through the connection electrode 1761. (See FIG. 17B.)

A liquid crystal display structured by the driver circuit 1806 having an n-channel TFT 1801, a p-channel TFT 1802, and an a-channel TFT 1803, and by the pixel region 1807 having the pixel TFT 1804 and the storage capacitor 1805, can thus be manufactured.

Embodiment 3

The various electro-optical devices (active matrix liquid crystal display device, active matrix EL display device and active matrix EC display device) can be formed by utilizing the present invention. Namely, the present invention can be implemented onto all of the electronic devices that incorporate such electro-optical devices as a display portion.

Following can be given as such electronic devices: video cameras; digital cameras; projectors; head mounted displays (goggle type displays); car navigation systems; car stereo; personal computers; portable information terminals (mobile computers, cellular phone or electronic books or the like.) or the like. Examples of these are shown in FIGS. 18A to 18F, 19A to 19C and 20A to 20C.

Figures 18A, 18B:
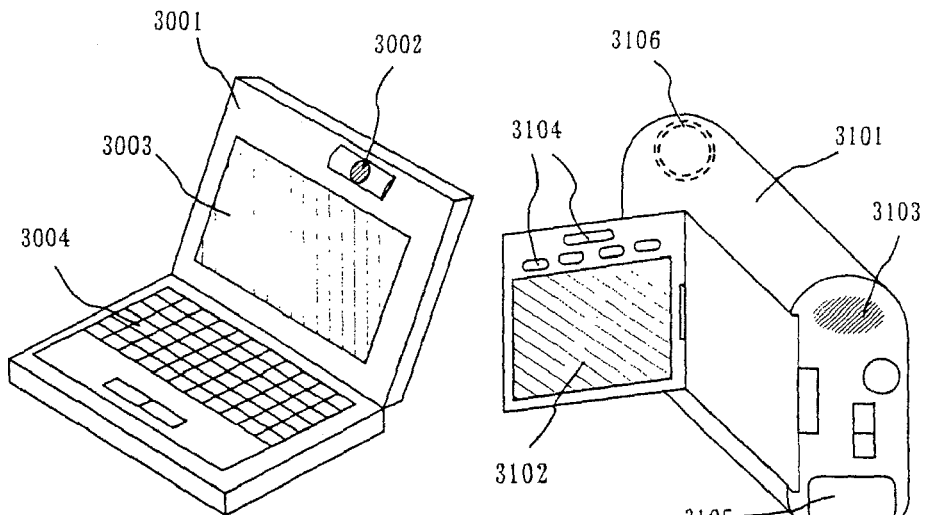
FIGS. 18A to 18F are diagrams for explaining examples of semiconductor devices.

FIG. 18A is a personal computer which comprises: a main body 3001; an image input section 3002; a display portion 3003; and a key board 3004. The present invention can be applied to the display portion 3003.

FIG. 18B is a video camera which comprises: a main body 3101; a display portion 3102; a voice input section 3103; operation switches 3104; a battery 3105 and an image receiving section 3106 or the like. The present invention can be applied to the display portion 3102.

Figures 18C, 18D:
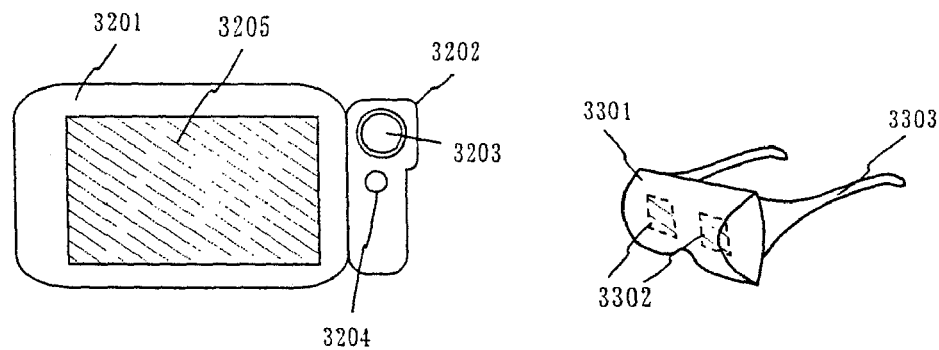

FIG. 18C is a mobile computer which comprises: a main body 3201; a camera section 3202; an image receiving section 3203; operation switches 3204 and a display portion 3205 or the like. The present invention can be applied to the display portion 3205.

FIG. 18D is a goggle type display which comprises: a main body 3301; a display portion 3302; and an arm section 3303 or the like. The present invention can be applied to the display portion 3302.

Figures 18E, 18F:
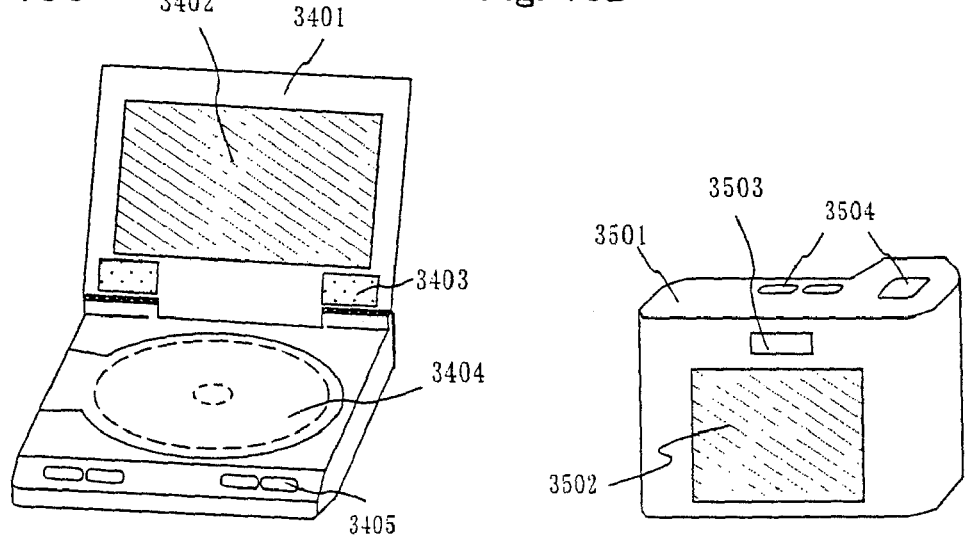

FIG. 18E is a player using a recording medium which records a program (hereinafter referred to as a recording medium) which comprises: a main body 3401; a display portion 3402; a speaker section 3403; a recording medium 3404; and operation switches 3405. This player uses DVD (digital versatile disc), CD, or the like for the recording medium, and can perform music appreciation, film appreciation, games and the use for Internet. The present invention can be applied to the display portion 3402.

FIG. 18F is a digital camera which comprises: a main body 3501; a display portion 3502; a view finder 3503; operation switches 3504; and an image receiving section (not shown in the figure) or the like. The present invention can be applied to the display portion 3502.

FIG. 19A is a front type projector which comprises: a projection device 3601; and a screen 3602. The present invention can be applied to the liquid crystal display device 3808 which forms a part of the projection device 3601 and other driver circuits.

FIG. 19B is a rear type projector which comprises: a main body 3701; a projection device 3702; a mirror 3703; and a screen 3704 or the like. The present invention can be applied to the liquid crystal display device 3808 which forms a part of the projection device 3702 and other driver circuits.

Note that FIG. 19C is a diagram which shows an example of the structure of a projection device 3601 and 3702 in FIGS. 19A and 19B. Projection device 3601 and 3702 comprise: an optical light source system 3801; mirrors 3802 and 3804 to 3306; a dichroic mirror 3803; a prism 3807; a liquid crystal display device 3808; a phase differentiating plate 3809; and a projection optical system 3810. The projection optical system 3810 comprises an optical system having a projection lens. Though the present embodiment shows an example of 3-plate type, this is not to limit to this example and a single plate type may be used for instance. Further, an operator may appropriately dispose the optical system such as an optical lens, a film which has a function to polarize light, a film which adjusts a phase difference or an IR film or the like in the optical path shown by an arrow in FIG. 19C.

FIG. 19D is a diagram showing an example of a structure of an optical light source system 3801 in FIG. 19C. In the present embodiment the optical light source system 3801 comprises: a reflector 3811; a light source 3812; lens arrays 3813 and 3814; a polarizer conversion element 3815; and a condenser lens 3816. Note that the optical light source system shown in FIG. 19D is merely an example and the structure is not limited to this example. For instance, an operator may appropriately dispose the optical system such as an optical lens, a film which has a function to polarize light, a film which adjusts a phase difference or an IR film, etc.

Note that the projectors shown FIG. 19 are the cases of using a transmission type electro-optical devices, and applicable examples of a reflection type electro-optical device and a light emitting display device are not shown.

Figure 20A:
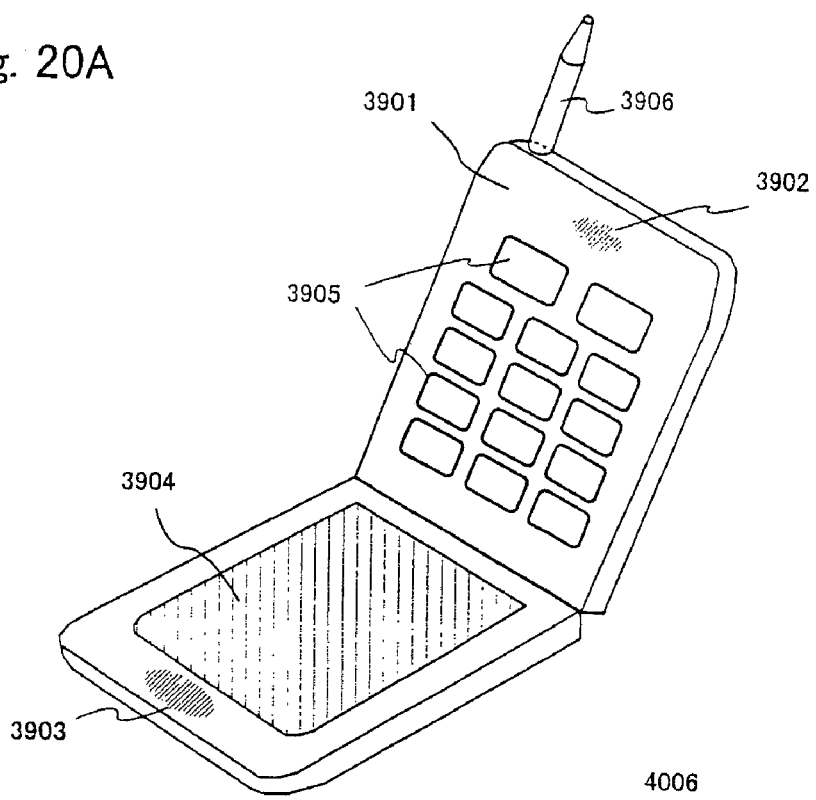
FIGS. 20A to 20C are diagrams for explaining examples of semiconductor devices.

FIG. 20A is a cellular phone which comprises: a main body 3901; a voice output section 3902; a voice input section 3903; a display portion 3904; operation switches 3905; and an antenna 3906 or the like. The present invention can be applied to the display portion 3904.

Figure 20B:
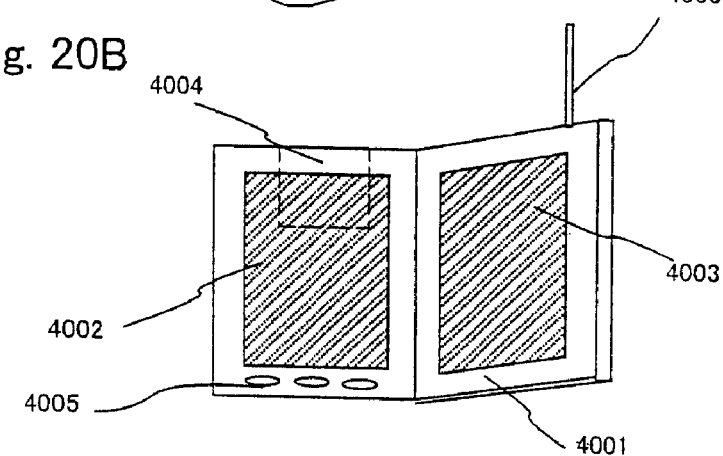

FIG. 20B is a portable book (electronic book) which comprises: a main body 4001; display portions 4002 and 4003; a recording medium 4004; operation switches 4005 and an antenna 4006 or the like. The present invention can be applied to the display portions 4002 and 4003.

Figure 20C:
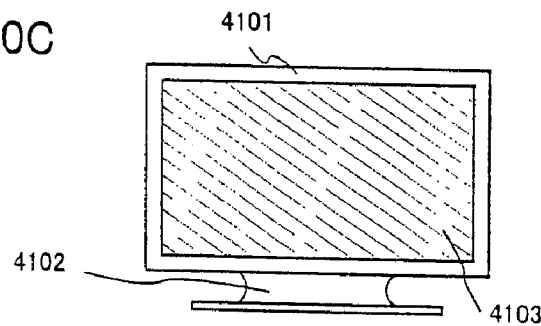
Figure 21A:
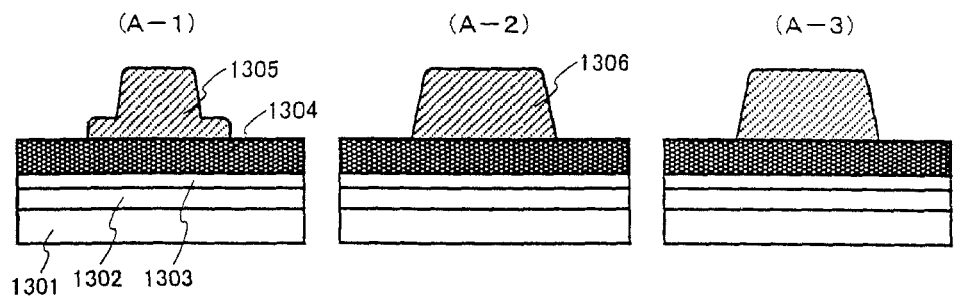
FIGS. 21A to 21D are a method of forming GOLD structure, LDD structure, and single drain structure polycrystalline silicon TFTs for different circuits by utilizing a photomask, or a reticle, used for forming a gate electrode in which a supplemental pattern having a function of reducing the intensity of light is set.
Figure 21B:
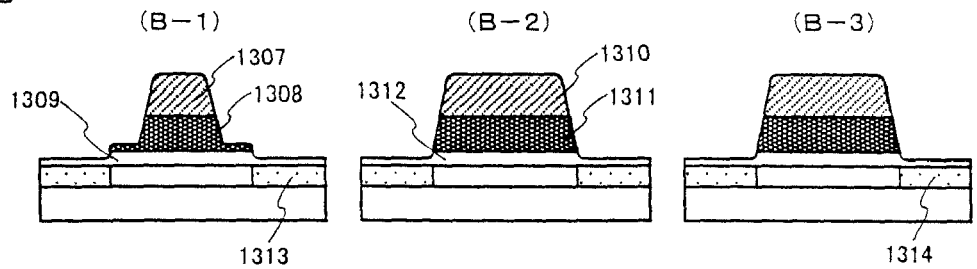
Figure 21C:
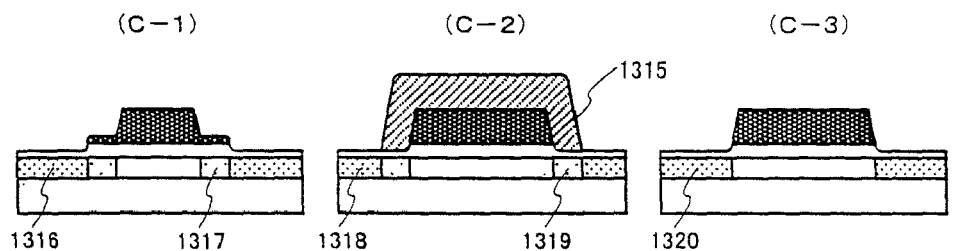
Figure 21D:
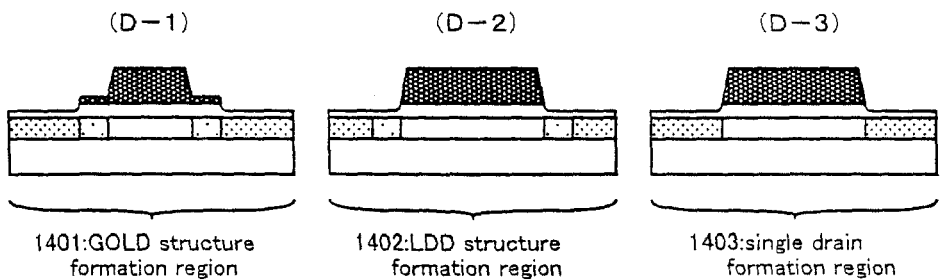

FIG. 20C is a display which comprises: a main body 4101; a supporting section 4102; and a display portion 4103 or the like. The present invention can be applied to the display portion 4103. The display of the present invention is advantageous specifically when large sized, and it is advantageous in a display having a diagonal exceeding 10 inches (specifically exceeding 30 inches).

As described above, the applicable range of the present invention is very large, and the invention can be applied to electronic devices of various areas. Note that the electronic devices of the present embodiment 3 can be achieved by utilizing any combination of constitutions in Embodiment modes 1 to 5 and Embodiments 1 to 2.

The present invention is one in which it is possible to easily manufacture a semiconductor device composed of GOLD structure transistors through etching and ion injection processes in accordance with applying photomasks or reticles used for forming gate electrodes and in which supplemental patterns having a function of reducing the intensity of light are established in mask patterns. The present invention is extremely effective in increasing the performance of the semiconductor device and reducing its manufacturing cost.

Further, it is possible to set the size of the supplemental patterns, having a function of reducing the intensity of light and which are set into the mask patterns, to an arbitrary length in the process of manufacturing the GOLD structure transistors, and therefore the size in the channel direction of low concentration impurity regions (n–regions) can be set to an arbitrary length. The present invention is therefore extremely effective in increasing the performance of the GOLD structure transistors.

Furthermore, it is possible to form LDD structure transistors having a large off current value suppression effect, GOLD structure transistors having a large effect against hot carriers, and single drain structure transistors separately, for different circuits, by changing the process steps from an ion injection process in the manufacture of a semiconductor device utilizing the photomasks or reticles used for forming gate electrodes. The present invention is therefore extremely effective in reducing the cost of the semiconductor device and in increasing its performance.

It is possible to form single drain structure, GOLD structure, and LDD structure transistors separately for each circuit of a semiconductor device in accordance with the establishment of supplemental patterns having a function of reducing the intensity of light in arbitrary mask patterns in a method of manufacturing a semiconductor device utilizing photomasks or reticles used for forming gate electrodes, and therefore the present invention is extremely effective in increasing the performance of the semiconductor device.

What is claimed is:

1. A method of manufacturing a semiconductor device comprising the steps of:
    forming a conductive film over a first semiconductor and a second semiconductor with an insulating film therebetween;
    forming a rectangular shape first resist pattern on the conductive film over the first semiconductor, and forming a second resist pattern on the conductive film over the second semiconductor, wherein a thickness of an edge portion of the resist pattern is smaller than thickness of a middle portion of the resist pattern;
    forming a rectangular shape first gate electrode over the first semiconductor by a first dry etching using the first resist pattern, and forming a second gate electrode by the first dry etching using the second resist pattern over the second semiconductor, wherein a thickness of an edge portion of the second gate electrode is smaller than a thickness of a middle portion of the second gate electrode;
    introducing an impurity element into the first semiconductor with the first gate electrode as a mask to form a first impurity region in the first semiconductor, wherein the first impurity region is not overlapped with the first gate electrode, and introducing an impurity element into the second semiconductor with the second gate electrode as a mask to form a second and a third impurity regions in the second semiconductor, wherein the second impurity region is not overlapped with the second gate electrode and the third impurity region is overlapped with the edge portion of the second gate electrode; and
    making the edge portion of the second gate electrode recede by a second dry etching.

2. The method of manufacturing a semiconductor device according to claim 1, wherein the edge portion of the resist pattern has tapered configuration.

3. The method of manufacturing a semiconductor device according to claim 1, wherein a diffraction grating pattern having a plurality of slit portions, or a translucent film portion, is used for forming the resist pattern.

4. The method of manufacturing a semiconductor device according to claim 1, wherein each of the first semiconductor and the second semiconductor is a semiconductor layer formed on an insulating surface.

5. The method of manufacturing a semiconductor device according to claim 1, wherein the first and the second semiconductors are formed in a semiconductor substrate.

6. The method of manufacturing a semiconductor device according to claim 1, wherein the semiconductor device is incorporated into an electronic device selected from the group consisting of a video camera, a digital camera, a projector, a head mounted display, a car navigation system, a car stereo, a personal computer, a portable information terminal.

7. A method of manufacturing a semiconductor device comprising the steps of:
  forming a conductive film over a first semiconductor and a second semiconductor with an insulating film therebetween;
  forming a first resist pattern on the conductive film over the first semiconductor and a second resist pattern on the conductive film over the second semiconductor, wherein a thickness of an edge portion of the first resist pattern and a second thickness of an edge portion of the second resist pattern are smaller than thickness of a middle portion each of the first and the second resist patterns;
  forming a first gate electrode by a first dry etching using the first resist pattern, wherein a first thickness of an edge portion of the first gate electrode is smaller than a thickness of a middle portion of the first gate electrode, and forming a second gate electrode by the first dry etching using the second resist pattern, wherein a second thickness of an edge portion of the second gate electrode is smaller than a thickness of a middle portion of the second gate electrode;
  removing the first and the second resist patterns;
  introducing an impurity element into the first semiconductor with the first gate electrode as a mask to form a first impurity region and a second impurity region in the first semiconductor, wherein the first impurity region is not overlapped with the first gate electrode and the second impurity region is overlapped with the edge portion of the first gate electrode, and introducing the impurity element into the second semiconductor with the second gate electrode as a mask to form a third impurity region and a fourth impurity region in the second semiconductor, wherein the third impurity region is not overlapped with the second gate electrode and the second impurity region is overlapped with the edge portion of the second gate electrode;
  making the edge portions of the first and the second gate electrodes recede by a second dry etching;
  forming a third resist pattern over the first gate electrode, wherein the second gate electrode is exposed from the third resist pattern; and
  making the edge portion of the second gate electrode recede by a third dry etching.

8. The method of manufacturing a semiconductor device according to claim 7, wherein the first and the second thicknesses are the same.

9. The method of manufacturing a semiconductor device according to claim 7, wherein the edge portion of the resist pattern has tapered configuration.

10. The method of manufacturing a semiconductor device according to claim 7, wherein a diffraction grating pattern having a plurality of slit portions, or a translucent film portion, is used for forming the resist pattern.

11. The method of manufacturing a semiconductor device according to claim 7, wherein each of the first semiconductor and the second semiconductor is a semiconductor layer formed on an insulating surface.

12. The method of manufacturing a semiconductor device according to claim 7, wherein the first and the second semiconductors are formed in a semiconductor substrate.

13. The method of manufacturing a semiconductor device according to claim 7, wherein the semiconductor device is incorporated into an electronic device selected from the group consisting of a video camera, a digital camera, a projector, a head mounted display, a car navigation system, a car stereo, a personal computer, a portable information terminal.

14. A method of manufacturing a semiconductor device comprising the steps of:
  forming a conductive film over a semiconductor with an insulating film therebetween;
  forming a rectangular shape first resist pattern on the conductive film, and forming a second resist pattern on the conductive film, wherein a thickness of an edge portion of the second resist pattern is smaller than thickness of a middle portion of the second resist pattern;
  forming a rectangular shape first gate electrode by a first dry etching using the first resist pattern, and forming a second gate electrode by the first dry etching using the second resist pattern, wherein a thickness of an edge portion of the second gate electrode is smaller than a thickness of a middle portion of the second gate electrode;
  removing the first and the second resist patterns;
  introducing an impurity element into the semiconductor with the first gate electrode as a mask to form a first impurity region in the semiconductor, wherein the first impurity region is not overlapped with the first gate electrode, and introducing the impurity element into the semiconductor with the second gate electrode as a mask to form a second and a third impurity regions in the semiconductor, wherein the second impurity region is not overlapped with the second gate electrode and the third impurity region is overlapped with the edge portion of the second gate electrode; and
  making the edge portion of the second gate electrode recede by a second dry etching.

15. The method of manufacturing a semiconductor device according to claim 14, wherein the edge portion of the resist pattern has tapered configuration.

16. The method of manufacturing a semiconductor device according to claim 14, wherein a diffraction grating pattern having a plurality of slit portions, or a translucent film portion, is used for forming the resist pattern.

17. The method of manufacturing a semiconductor device according to claim 14, wherein each of the first semiconductor and the second semiconductor is a semiconductor layer formed on an insulating surface.

18. The method of manufacturing a semiconductor device according to claim 14, wherein the first and the second semiconductors are formed in a semiconductor substrate.

19. The method of manufacturing a semiconductor device according to claim 14, wherein the semiconductor device is incorporated into an electronic device selected from the group consisting of a video camera, a digital camera, a projector, a head mounted display, a car navigation system, a car stereo, a personal computer, a portable information terminal.

* * * * *

UNITED STATES PATENT AND TRADEMARK OFFICE
CERTIFICATE OF CORRECTION

PATENT NO. : 8,324,032 B2
APPLICATION NO. : 13/152492
DATED : December 4, 2012
INVENTOR(S) : Hideto Ohnuma and Ichiro Uehara Page 1 of 1

It is certified that error appears in the above-identified patent and that said Letters Patent is hereby corrected as shown below:

In the Specification:

Column 2, line 5, after "possess a" delete the word "is";

Column 2, line 9, after "p-regions)" insert the word --is--;

Column 6, line 57, after "that" insert the word --it--;

Column 10, line 18, replace "stricture" with --structure--;

Column 10, line 26, replace "stricture" with --structure--;

Column 15, line 35, replace "totaling" with --forming--;

Column 19, line 15, replace "bath" with --both--;

Column 20, line 46, replace "chancres" with --changes--;

Column 24, line 17, replace "93" with --9B--;

Column 24, line 21, replace "one" with --on--;

Column 26, line 49, replace "603" with --608--;

Column 30, line 6, replace "for" with --form--;

Column 32, line 20, replace "fowled" with --formed--;

Column 33, line 53, after "impurity" delete the word "a";

Column 34, line 16, replace "a channel" with --n-channel--; and

Column 35, line 15, replace "3306" with --3806--.

Signed and Sealed this
Twenty-fourth Day of September, 2013

Teresa Stanek Rea
*Deputy Director of the United States Patent and Trademark Office*